(12) United States Patent
Koshi et al.

(10) Patent No.: US 8,743,920 B2
(45) Date of Patent: Jun. 3, 2014

(54) WAVELENGTH VARIABLE LIGHT SOURCE SYSTEM

(75) Inventors: Hiroyuki Koshi, Tokyo (JP); Koji Horikawa, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 120 days.

(21) Appl. No.: 12/748,083

(22) Filed: Mar. 26, 2010

(65) Prior Publication Data

US 2010/0246614 A1    Sep. 30, 2010

(30) Foreign Application Priority Data

Mar. 27, 2009   (JP) ................................. 2009-079682

(51) Int. Cl.
*H01S 3/13*   (2006.01)
*H01S 5/06*   (2006.01)
*H01S 5/068*  (2006.01)

(52) U.S. Cl.
CPC ........... *H01S 5/0617* (2013.01); *H01S 5/06808* (2013.01); *H01S 5/06804* (2013.01)
USPC ............ 372/29.011; 372/29.014; 372/29.015; 372/29.021; 372/31; 372/32

(58) Field of Classification Search
CPC . H01S 5/068; H01S 5/06804; H01S 5/06808; H01S 5/06812; H01S 5/0683; H01S 5/06837; H01S 5/0687; H01S 3/10069; H01S 5/0617
USPC ............ 372/29.011, 29.014, 29.015, 29.021, 372/31, 32, 34, 36, 38.01, 38.02, 38.07
See application file for complete search history.

(56) References Cited

U.S. PATENT DOCUMENTS

| 4,710,631 A * | 12/1987 | Aotsuka et al. ............ 250/354.1 |
| 5,812,572 A * | 9/1998 | King et al. ................. 372/38.04 |
| 6,369,926 B1 * | 4/2002 | Lyu et al. ........................ 398/95 |

(Continued)

FOREIGN PATENT DOCUMENTS

| CN | 1359178 | 7/2002 |
| CN | 1359178 A | 7/2002 |

(Continued)

OTHER PUBLICATIONS

Chinese Patent Application No. 201010136627.1: Second Office Action dated Jul. 10, 2013, 18 pages.

(Continued)

*Primary Examiner* — Jessica Stultz
*Assistant Examiner* — Joshua King
(74) *Attorney, Agent, or Firm* — Baker & Hostetler LLP

(57) ABSTRACT

There is provided a wavelength variable light source system capable of changing wavelength and intensity of output signal light and of improving preset accuracy and stability of the wavelength and strength of the output signal light. The system determines the both or either one of a target value for controlling wavelength and a target value for controlling intensity of output signal light of a wavelength variable light source by correlating a combination of the target wavelength and the target light output intensity specified from a higher-level device and controls operation states of the wavelength variable light source so that output values of monitoring circuits for monitoring the operation state of the wavelength variable light source converge to the target values.

17 Claims, 18 Drawing Sheets

(56) References Cited

U.S. PATENT DOCUMENTS

| | | | |
|---|---|---|---|
| 6,690,693 B1* | 2/2004 | Crowder | 372/29.02 |
| 7,136,772 B2* | 11/2006 | Duchi et al. | 702/118 |
| 2002/0071458 A1* | 6/2002 | Iwafuji | 372/23 |
| 2002/0181521 A1* | 12/2002 | Crowder et al. | 372/38.02 |
| 2003/0231665 A1* | 12/2003 | Ichino | 372/32 |
| 2004/0114646 A1 | 6/2004 | Stewart et al. | |
| 2005/0286578 A1* | 12/2005 | Uchida et al. | 372/34 |
| 2006/0083275 A1* | 4/2006 | Stewart et al. | 372/34 |
| 2006/0222025 A1* | 10/2006 | Ono et al. | 372/34 |
| 2008/0107431 A1* | 5/2008 | Lee et al. | 398/196 |
| 2009/0080904 A1 | 3/2009 | Nakamoto | |

FOREIGN PATENT DOCUMENTS

| | | |
|---|---|---|
| EP | 1215832 | 6/2002 |
| EP | 2017666 | 1/2009 |
| JP | 09-219554 | 8/1997 |
| JP | 11-220198 | 8/1999 |
| JP | 2002-185074 | 6/2002 |
| JP | 2009-044024 | 2/2009 |

OTHER PUBLICATIONS

Japanese Patent Application No. 2009-079682: Decision of Refusal dated Oct. 8, 2013, 3 pages.

Japanese Patent Application No. 2009-079682: Official Action dated Feb. 15, 2013, 5 pages with English Translation.

European Patent Application No. 10157724.5: Extended European Search Report dated Nov. 27, 2013, 12 pages.

Chinese Patent Applicaiton No 201010136627.1: Third Office Action dated Feb. 24, 2014, 13 pages.

* cited by examiner

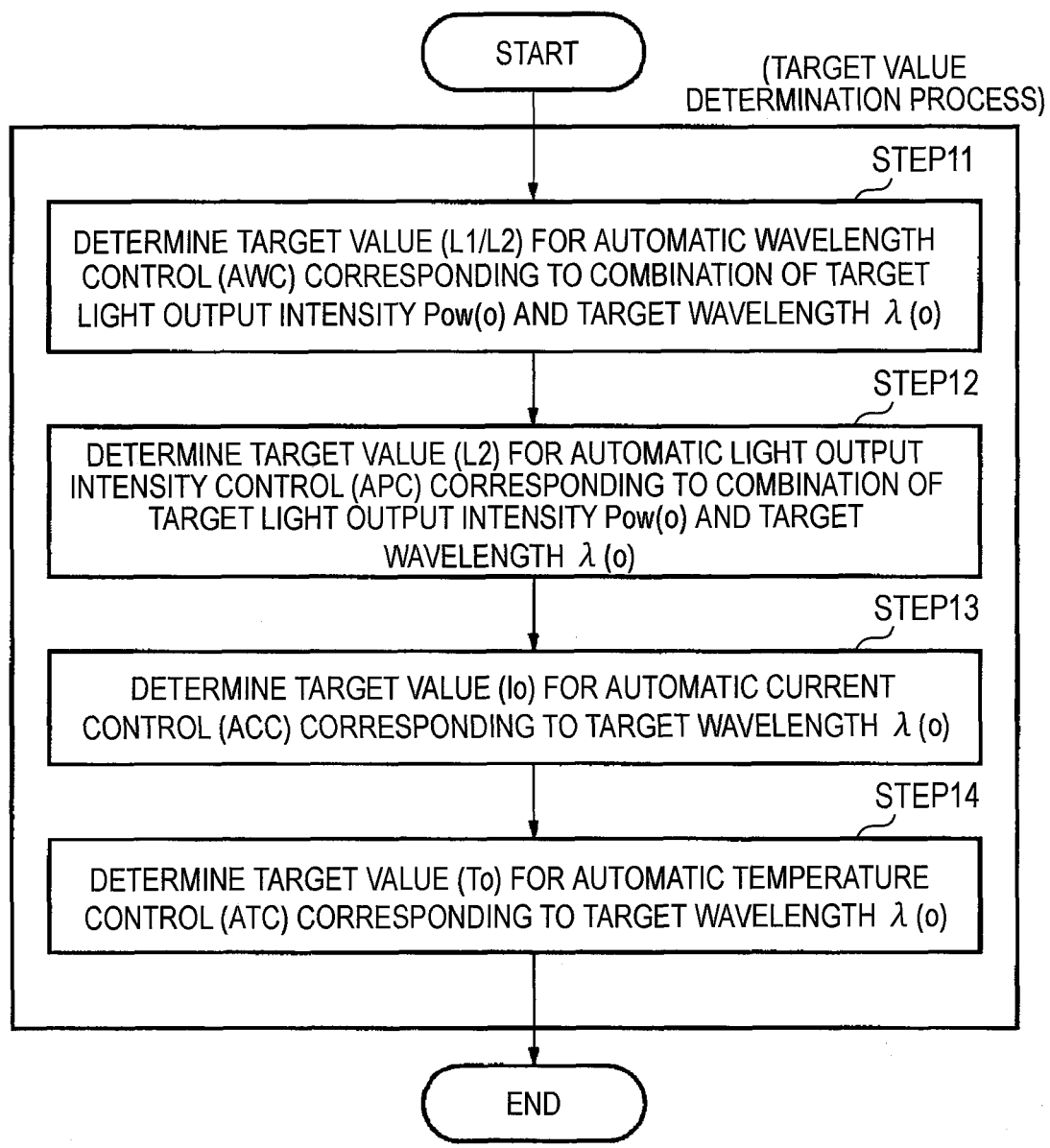

WAVELENGTH VARIABLE LIGHT SOURCE SYSTEM

CROSS-REFERENCE TO RELATED CASES

This application claims priority to Japanese Patent Application No. 2009-079682 filed Mar. 27, 2009 and is hereby incorporated by reference in its entirety.

TECHNICAL FIELD

The present invention relates to a wavelength variable light source system for optical communications and other fields.

BACKGROUND

Research and development activities for realizing over-all high-functional optical communications are being aggressively promoted in the optical communications network field. Prior WDM systems exhibit narrowband wavelength intervals from about 200 GHz-50 GHz and from about 100 GHz to about 25 GHz, within which several wave lengths may be selected. The number of selected wavelengths available for optical communications may increase from the order of tens of wavelength values to the order of hundreds of wavelength values. In order to effectuate these changes, there is a need for a wavelength variable light source system capable of dynamically changing wavelength and light output intensity of the output signal light.

FIG. 17 is a block diagram illustrating a configuration of a prior art wavelength variable light source system. The wavelength variable light source system 211 includes a wavelength variable light source 212 and a control circuit 214 for controlling the wavelength variable light source 212 in accordance with instructions from a higher-level device 213.

As a signal light device of the wavelength variable light source 212, a semiconductor laser 215 may be used. The semiconducting laser may be a DFB (Distributed Feedback) laser that controls wavelength of the output signal light by controlling device temperature or it may be a DBR (Distributed Bragg Reflector) laser that controls wavelength of the output signal light by controlling driving current.

The wavelength variable light source 212 comprises the semiconductor laser 215 and a thermoelectric cooler (TEC) 216 for controlling the temperature of the semiconductor laser 215. The semiconductor laser 215 is mounted on the TEC 216. A TEC temperature detector 217 is installed on the TEC 216. A beam splitter (BS) 218 for splitting part of the output signal light from the semiconductor laser 215 is provided on an optical axis of the semiconductor laser 215 and a wavelength filter 219 that transmits only light of specific wavelength and a photodiode (PD) 220 that detects the transmitted light are provided on a split-side optical axis of the BS 218.

The control circuit 214 has; a current monitoring circuit 221 for monitoring the driving current of the semiconductor laser 215, a temperature monitoring circuit 222 for monitoring the temperature of the semiconductor laser 215 based on the TEC temperature detector 217, an output signal light monitoring circuit 223 for monitoring intensity of the signal light of a specific wavelength component contained in the output signal light of the semiconductor laser 215 based on an output of the PD 220, a CPU (Central Processing Unit) 224 that outputs a LD (Light Diode) driving current control signal for controlling the driving current of the semiconductor laser 215, a TEC temperature control signal for controlling the temperature of the semiconductor laser 215 based on outputs of these monitoring circuits 221, 222, and 223, a LD driving circuit 225 for driving the semiconductor laser 215 corresponding to the LD driving current control signal, and a TEC driving circuit 226 for driving the TEC 216 corresponding to the TEC temperature control signal.

Output signals of the monitoring circuits 221, 222, and 223 are converted into digital signals respectively by ADCs (Analog Digital Converters) 227, 228, and 229; and are transmitted to the CPU 224. The LD driving current control signal and the TEC temperature control signal outputted out of the CPU 224 are converted into analog signals respectively by DACs (Digital Analog Converters) 230 and 231, and are inputted to the LD driving circuit 225 and the TEC driving circuit 226. The control circuit 214 controls the wavelength variable light source 212 so that the wavelength of the output signal light becomes constant by performing a feedback control while monitoring the driving current, temperature, and intensity of the signal light of the semiconductor laser 215 so that differences between those values and their target values are eliminated. It is noted that the content of the control is different when the semiconductor laser 215 is the DFB laser and when it is the DBR laser.

In the case of the wavelength variable light source 212 when the DFB laser is used as the semiconductor laser 215, the temperature and signal light output intensity of the semiconductor laser 215 are monitored. Information from this monitoring are used to create a feedback control for determining a command value of the TEC temperature. The command temperature value is used such that differences between actual values and target values are eliminated to control the wavelength of the output signal light. The CPU 224 also simultaneously carries out a feedback control for maintaining a constant driving current of the semiconductor laser 215 based on the output value of the current monitoring circuit 221. The current feedback is independent of the feedback control for adjusting the temperature.

In the case of the wavelength variable light source 212 when the DBR laser is used as the semiconductor laser 215, the driving current and signal light output intensity of the semiconductor laser 215 are monitored. A feedback control for determining a command value of the driving current is established so that the difference between the actual value and target value of the current is eliminated in order to control the output signal light. The CPU 224 also simultaneously carries out the feedback control for maintaining the temperature of the semiconductor laser 215 constant based on the output value of the TEC temperature detector 217 independently of the feedback control for adjusting the current.

Applicants incorporate by reference Japanese Patent Application Laid-open No. Hei. 9-219554 which describes a wavelength control technology for controlling wavelength of output signal light by detecting intensity of light signal by inputting light from the semiconductor laser to a wavelength filter whose transmission characteristics is inverse and by adjusting temperature of the semiconductor laser corresponding to a difference of the detected intensity of the light signal. Applicants also incorporate by reference Japanese Patent Application Laid-open No. Hei. 11-220198 which describes a wavelength control technology of controlling wavelength of output signal light by controlling a movement of a reflecting surface in an outside resonance section based on absorption wavelength detected by a wavelength detecting section.

In order to build a high functional optical communication network, it is desirable to increase a wavelength variable range and a number of wavelengths. Further, it is desirable to increase the variability of the intensity of output signal by a wavelength variable light source system. Typically, it had been required to mount a plurality of semiconductor lasers and a SOA (Semiconductor Optical Amplifier) within the wavelength variable light source system.

However, with the advance of the functions of the wavelength variable light source systems, problems related to influences of heat and light scatter within the wavelength variable light source system and their effects on output characteristics have outpaced the needs for setting accuracy and stability of the output wavelength and intensity of the optical output.

SUMMARY

Accordingly, the present invention provides a wavelength variable light source system capable of changing wavelength and intensity of output signal light. In one embodiment, there is improved setting accuracy and stability of the wavelength and intensity of the output signal light.

Requirements for optical communication include, for the wavelength, setting accuracy and stability of around 0.1 GHz (0.8 pm) in a 1550 nm band. For the intensity of optical output, setting accuracy and stability of around 0.01 dB is required in a range of 10 dBm+/−5 dB.

The following technical means are adopted to solve the above mentioned problems. That is, according to a first aspect of the invention, there is provided a wavelength variable light source system, comprising: a wavelength variable light source having a wavelength variable semiconductor laser that varies signal light and an optical amplifier that amplifies the output signal light of the wavelength variable semiconductor laser; and a control circuit for controlling the wavelength variable semiconductor laser and the optical amplifier so that wavelength and intensity of the output signal light of the wavelength variable light source converge to target wavelength and target intensity specified from a higher-level device; wherein the control circuit has: one or more monitoring circuits for monitoring operation states to control the wavelength variable semiconductor laser and the optical amplifier; and a parameter table in which a combination of the target wavelength and the target intensity is correlated with target values of the operation states; and wherein the wavelength variable light source system determines the target values of the operation states corresponding to the combination of the target wavelength and the target intensity every time when the target wavelength and the target intensity are specified from the higher-level device by referencing the parameter table and controls the wavelength variable light source so that the output values of the monitoring circuits converge to the target values.

The wavelength variable light source system constructed as described above determines the target values of the operation states corresponding to the combination of the specified target wavelength and target intensity every time when the target wavelength and target intensity are specified from the higher-level device by referencing the parameter table. Then, the wavelength variable light source system controls the wavelength variable light source so that the monitoring values of the operation states converge to the target values. Thereby, it becomes possible to change the wavelength and intensity of the output signal light and to assure the setting accuracy and stability of the both.

According to a second aspect of the invention, in the wavelength variable light source system of the first aspect, the control circuit determines a target value for controlling wavelength and a target value for controlling light output intensity as the target values of the operation states.

According to a third aspect of the invention, in the wavelength variable light source system of the second aspect, the wavelength variable light source has first and second beam splitters provided on an optical axis of the optical amplifier, a wavelength filter provided on a split-side optical axis of the first beam splitter, a first photo diode provided on an output optical axis of the wavelength filter, a second photo diode provided on the split-side optical axis of the second beam splitter and a temperature controller for controlling temperature of the semiconductor laser; wherein the target value for controlling the wavelength includes at least one of values to be monitored of the temperature of the wavelength variable semiconductor laser, the driving current of the wavelength variable semiconductor laser, a light-receiving current of the first photo diode, light-receiving intensity of the first photo diode, a ratio between the light-receiving current of the first photo diode and a light-receiving current of the second photo diode and a ratio between light-receiving intensity of the first photo diode and light-receiving intensity of the second photo diode.

According to a fourth aspect of the invention, in the wavelength variable light source system of the second aspect, the wavelength variable light source has the beam splitter provided on the optical axis of the optical amplifier and a photo diode provided on the split-side optical axis of the beam splitter; wherein the target value for controlling the light output intensity includes at least one among the driving current of the optical amplifier, the light-receiving current of the photo diode and the light-receiving intensity of the photo diode.

According to a fifth aspect of the invention, in the wavelength variable light source system of the second or third aspect, the target value for controlling wavelength is controlled based on ambient temperature at that moment.

According to a sixth aspect of the invention, in the wavelength variable light source system of the second or fourth aspect, the target value for controlling the light output intensity is controlled based on the ambient temperature at that moment.

According to a seventh aspect of the invention, in the wavelength variable light source system of the fifth or sixth aspect, the control circuit comprises a monitoring circuit for monitoring the ambient temperature; and a target value correction table correlating the ambient temperature and a correction value of the target value of the operation state; and determines the target value of the operation state corresponding to a combination of the specified target wavelength and target intensity every time when the target wavelength and target intensity are specified from the higher-level device by referencing the parameter table; determines the correction value of the target value of the operation state corresponding to the ambient temperature at that moment by referencing the target value correction table; and controls the wavelength variable light source so that the monitoring value of the operation state based on the output value of the monitoring circuit converges to the correction value.

According to an eighth aspect of the invention, in the wavelength variable light source system of any one of the first through seventh aspects, the control circuit has AD conversion circuits provided per each monitoring circuit to convert the output value of the monitoring circuit into a digital signal; determines at least one of a monitoring value conversion factor for controlling wavelength and a monitoring value conversion factor for controlling light output intensity by correlating with the combination of the target wavelength and the target intensity; and controls the wavelength variable light source so that the value converted from an output value of the AD conversion circuit by the monitoring value conversion factor converges to the target value.

According to a ninth aspect of the invention, in the wavelength variable light source system of the eighth aspect, the control circuit has a conversion factor table correlating the combination of the target wavelength and target intensity with the monitoring value conversion factor; and determines the monitoring value conversion factor corresponding to the combination of specified target wavelength and target intensity by referring the conversion factor table every time when the higher-level device specifies the target wavelength and the target intensity.

According to a tenth aspect of the invention, in the wavelength variable light source system of the eighth aspect, the control circuit has a wavelength dependent factor table correlating the target wavelength with a wavelength dependent component of the monitoring value conversion factor; and a correction factor table correlating the target intensity with an output value correction factor of the AD converting circuit; determines the wavelength dependent component of the monitoring value conversion factor corresponding to the target wavelength by referencing the wavelength dependent factor table and determines the output value correction factor corresponding to the target intensity by referencing the correction factor table; and uses a value obtained by multiplying the wavelength dependent component with the output value correction factor as the monitoring value conversion factor.

According to an eleventh aspect of the invention, in the wavelength variable light source system of any one of the eighth through tenth aspects, the both or either one of the monitoring value conversion factor for controlling wavelength and the monitoring value conversion factor for controlling light output intensity are adjusted based on the ambient temperature at that moment.

According to a twelfth aspect of the invention, in the wavelength variable light source system of the eleventh aspect, the control circuit has a monitoring circuit for monitoring the ambient temperature; and a conversion factor table correlating the ambient temperature with the monitoring value conversion factor; and determines the monitoring value conversion factor corresponding to the ambient temperature at that moment by referencing the conversion factor table.

According to a thirteen aspect of the invention, in the wavelength variable light source system of any one of the eighth through twelfth aspects, the wavelength variable light source has the wavelength variable semiconductor laser for oscillating signal light, the optical amplifier for amplifying the output signal light of the wavelength variable semiconductor laser, the first and second beam splitters provided on the optical axis of the optical amplifier, the wavelength filter provided on the split-side optical axis of the first beam splitter, a first photo diode provided on an output optical axis of the wavelength filter, a second photo diode provided on the split-side optical axis of the second beam splitter and a temperature controller for controlling temperature of the wavelength variable semiconductor laser; and the monitoring value conversion factor for controlling wavelength includes at least one value among the conversion factor for temperature of the semiconductor laser, the conversion factor for the driving current of the semiconductor laser, the conversion factor for the light-receiving current of the first photo diode, the conversion factor for the light-receiving intensity of the first photo diode, the conversion factor for the light-receiving current of the second photo diode and the conversion factor for the light-receiving intensity of the second photo diode.

According to a fourteenth aspect of the invention, in the wavelength variable light source system of any one of the eighth through twelfth aspects, the wavelength variable light source has the wavelength variable semiconductor laser that varies signal light, the optical amplifier for amplifying the output signal light of the wavelength variable semiconductor laser, the beam splitter provided on the optical axis of the optical amplifier and the photo diode provided on the split-side optical axis of the beam splitter; and the monitoring value conversion factor for controlling light output intensity includes at least one value among the conversion factor for the driving current of the optical amplifier, the conversion factor for the light-receiving current of the photo diode and the conversion factor for the light-receiving intensity of the photo diode.

According to a aspect of the invention, in the wavelength variable light source system of any one of the first through fourteenth aspects, the wavelength variable semiconductor laser is a semiconductor laser capable of controlling wavelength by adjusting its diode temperature.

According to an aspect of the invention, in the wavelength variable light source system of any one of the first through fourteenth aspects, the wavelength variable semiconductor laser is a semiconductor laser capable of controlling wavelength by adjusting its driving current.

Advantages of the Invention

Accordingly, the wavelength variable light source system of the invention is capable of changing wavelength and intensity of output signal light and of improving setting accuracy and stability of the wavelength and intensity of the output signal light.

BRIEF DESCRIPTION OF THE DRAWINGS

FIG. 3 is a flowchart showing a procedure for processing a target value determining process of a wavelength variable light source of the invention.

FIGS. 5a and 5b are a flowchart showing a processing procedure when the wavelength variable light source system of the invention receives a wavelength change command and an optical output intensity change command from the higher-level device in a state of light output ON.

FIG. 6 is a flowchart showing a processing procedure when the wavelength variable light source system of the invention receives an optical output intensity change command from the higher-level device in the state of light output ON.

FIG. 8 is a flowchart showing a processing procedure when the wavelength variable light source system of the invention receives an optical output OFF command from the higher-level device in the state of light output ON.

DETAILED DESCRIPTION OF ILLUSTRATIVE EMBODIMENTS

Figure 1:
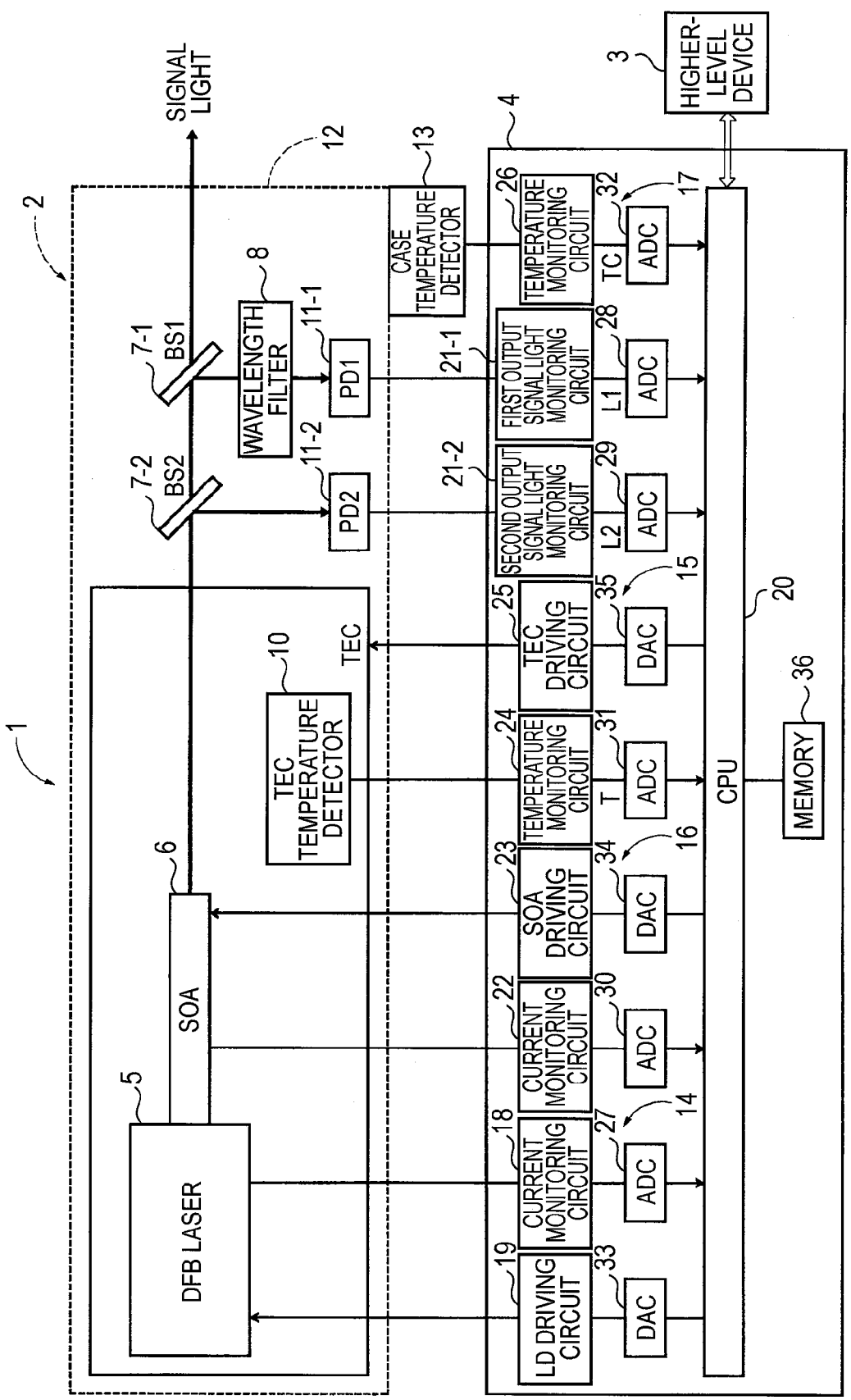
FIG. 1 is a block diagram showing an exemplary configuration of a wavelength variable light source system of the invention.

FIG. 1 is a block diagram showing an exemplary configuration of a wavelength variable light source system. The wavelength variable light source system 1 has a wavelength variable light source 2 and a control circuit 4 for controlling the wavelength variable light source 2 in accordance to an instruction from a higher-level device 3.

In an embodiment, the wavelength variable light source 2 has a DFB laser 5, a SOA 6 that amplifies output signal light of the DFB laser 5, first and second BSs 7-1 and 7-2 provided on an optical axis of the SOA 6, a wavelength filter 8 provided on an optical axis on the split side of the first BS 7-1, and a TEC 9 that controls temperature of the DFB laser 5. The DFB laser 5 and the SOA 6 may be mounted on the TEC 9. The TEC 9 can be provided with a TEC temperature detector 10. PDs 11-1 and 11-2 may be provided respectively on the output optical axis of the wavelength filter 8 and on a split-side optical axis of the second BS 7-2. These may be stored within the same case 12 (shown by a dotted line). The case 12, may include a case temperature detector 13 that detects temperature (ambient temperature: Tc) of the case 12.

The control circuit 4 can have a LD driving current control loop 14 for controlling a driving current of the DFB laser 5, a LD temperature control loop 15 for controlling temperature of the DFB laser 5, a SOA driving current control loop 16 for controlling a driving current of the SOA 6 and an ambient temperature dependency suppressing circuit 17.

In an embodiment, the LD driving current control loop 14 may be composed of a current monitoring circuit 18 for monitoring the driving current I of the DFB laser 5, a LD driving current 19 for driving the DFB laser 5, and a CPU 20.

In one embodiment of the LD driving current control loop 14, the CPU 20 can function as a digital control circuit that outputs a LD driving current control signal for controlling the driving current I of the DFB laser 5 based on an output of the current monitoring circuit 18.

In one embodiment, the SOA driving current control loop 16 is composed of a second output signal light monitoring circuit 21-2 for monitoring intensity of output of the DFB laser 5 amplified by the SOA 6 based on an output L2 of the PD (PD 2) 11-2, a current monitoring circuit 22 for monitoring the driving current of the DFB laser 5, a SOA driving circuit 23 for driving the SOA 6 and the CPU 20.

In one embodiment of the SOA driving current control loop 16, the CPU 20 may function as a digital control circuit that outputs a SOA driving current control signal for controlling the driving current of the SOA 6 based on an output of the second output signal light monitoring circuit 21-2 and the current monitoring circuit 22. The CPU 20 may control output intensity of the DFB laser 5 amplified by the SOA 6 based on an output value L2 of the second output signal light monitoring circuit 21-2 and a target value L2$o$.

The LD temperature control loop 15 may be composed of a first output signal light monitoring circuit 21-1 for monitoring intensity of component of output signal light of specific wavelength of the DFB laser 5 amplified by the SOA 6 based on an output L1 of the PD (PD 1) 11-1, a second output signal light monitoring circuit 21-2 for monitoring the output intensity of the DFB laser 5 amplified by the SOA 6 based on the output L2 of the second PD 11-2, a temperature monitoring circuit 24 for monitoring temperature (TEC temperature) of the DFB laser 5 based on an output of the TEC temperature detector 10, and a TEC driving circuit 25 for driving the TEC 9 and the CPU 20.

In the LD temperature control loop 15, the CPU 20 may function as a digital control circuit that outputs a TEC temperature control signal for controlling the temperature of the DFB laser 5 based on the outputs L1 and L2 of the first and second output signal light monitoring circuits 21-1 and 21-2 and on an output T of the temperature monitoring circuit 24. The CPU 20 may control varying wavelength of the DFB laser 5 amplified by based on a ratio of an output value of the first output signal light monitoring circuit 21-1 and an output value of the second output signal light monitoring circuit 21-2, i.e., L1/L2, and on target values L1$o$/L2$o$.

The ambient temperature dependency suppressing circuit 17 can comprise a temperature monitoring circuit 26 for monitoring temperature of the case 12 based on an output of the case temperature detector 13 and the CPU 20.

In an embodiment comprising the ambient temperature dependency suppressing circuit 17, the CPU 20 may obtain the ambient temperature Tc based on the output of the case temperature detector 13.

In an embodiment, output signals of the respective monitoring circuits 18, 21-1, 21-2, 22, 24 and 26 may be converted into digital signals by ADCs 27 through 32 and are transmitted to the CPU 20. The LD driving current control signal, SOA driving current control signal and TEC temperature control signal outputted from the CPU 20 may be converted into analog signals respectively by DACs 33 through 35. The analog signals may be inputted to the LD driving current 19, the SOA driving circuit 23 and the TEC driving circuit 25. The CPU 20 may comprise a rewritable memory 36. The CPU 20 executes various processes according to programs and data stored in the memory 36. The memory 36 has stored thereon, a parameter table in which a combination of target wavelength λ(o) and target output strength Pow(o) are correlated with target values (Io, L2$o$, L1$o$/L2$o$, To) of operation states (I, L2, L1/L2, T). The processes executed by the CPU 20 can include external communication processes with the higher-level device 3, internal communication processes with peripheral devices and others beside the processes for monitoring and controlling the various operation states.

In one embodiment of the LD driving current control loop 14, the CPU 20 may periodically monitor the driving current I of the DFB laser 5 and update a value of the LD driving current control signal by PID (Proportional-Integral-Derivative) control so that a difference between the determined value and the target value Io is eliminated. Thereby, automatic current control (ACC) of the DFB laser 5 may be realized.

In one embodiment of the SOA driving current control loop 16, the CPU 20 periodically monitors the light-receiving current L2 of the whole output signal light of the DFB laser 5 amplified by the SOA 6. The CPU may update the value of the SOA driving current control signal by the PID control so that the difference between the determined value L2 and the target value L2o is eliminated. Thereby, automatic power control (APC) of the SOA 6 may be realized.

Figure 16:
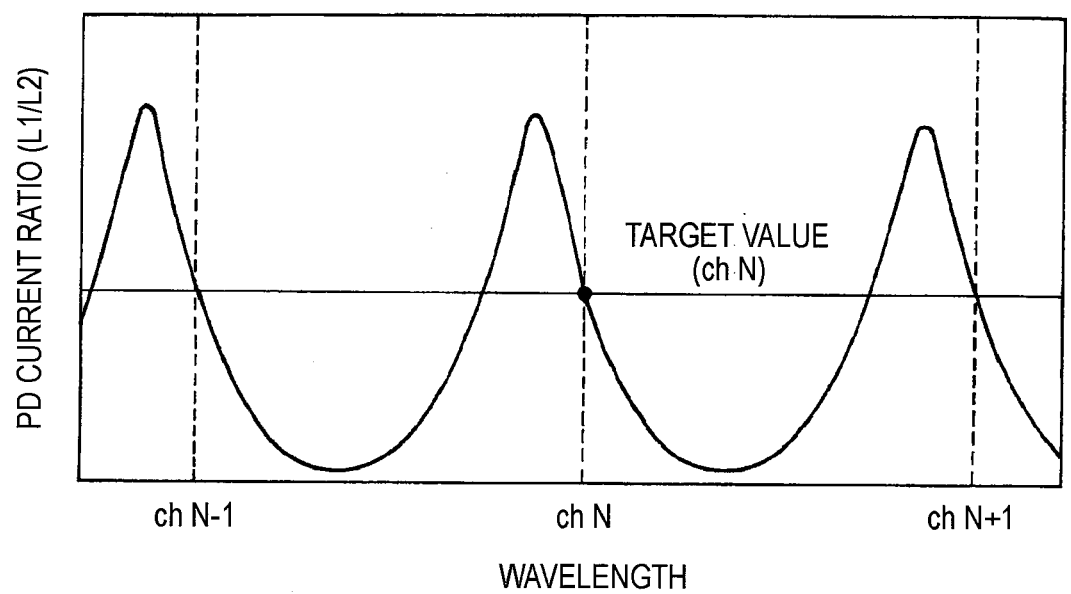
FIG. 16 is a graph showing a wavelength discriminating curve of the wavelength variable light source system.
Figure 17:
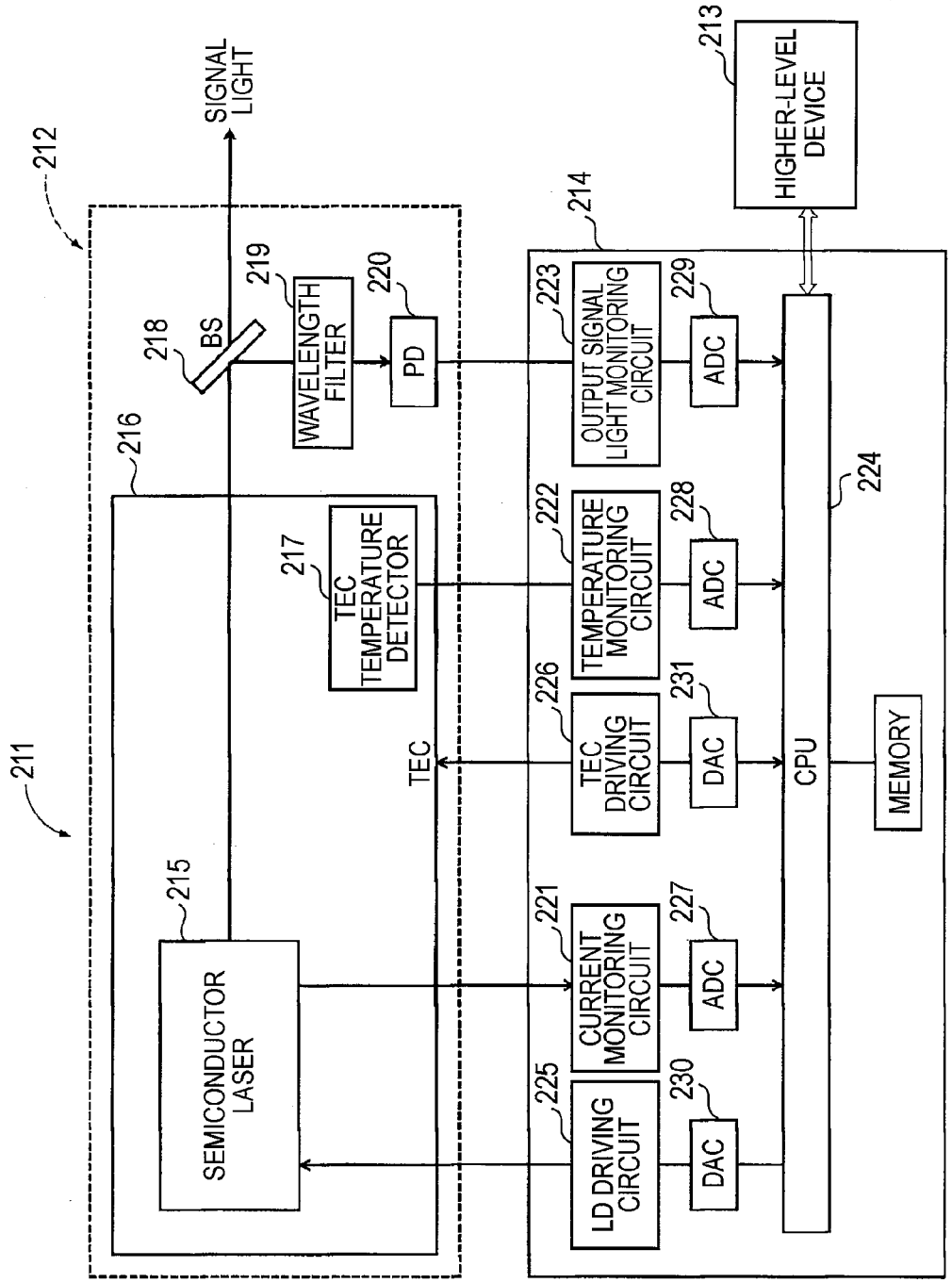
FIG. 17 is a block diagram illustrating a configuration of a prior art wavelength variable light source system.

In the LD temperature control loop 15, the CPU 20 may periodically monitor the temperature T of the DFB laser 5 and update a value of the TEC temperature control signal by the PID control so that a difference between that value and the target value To is eliminated. The CPU 20 may also periodically monitor a ratio of intensity L1/L2 of the whole output signal light and signal light of a specific wavelength component of the DFB laser 5 and updates a value of the TEC temperature control signal by the PID control so that a difference between that value L1/L2 and the target value L1o/L2o is eliminated. Thereby, automatic current control (AWC) of the DFB laser 5 and automatic temperature control (ATC) of the TEC 9 may be realized at the same time. There exists a cyclic relationship as shown in FIG. 16 between varying wavelength and the ratio of intensity L1/L2 of the DFB laser 5. This ratio of intensity L1/L2 of the signal light of each wavelength determined in advance may be converged to the target value by controlling the oscillating wavelength of the DFB laser 5. Hereinafter, the curve of FIG. 16 is called a wavelength discriminating curve.

Figure 2:
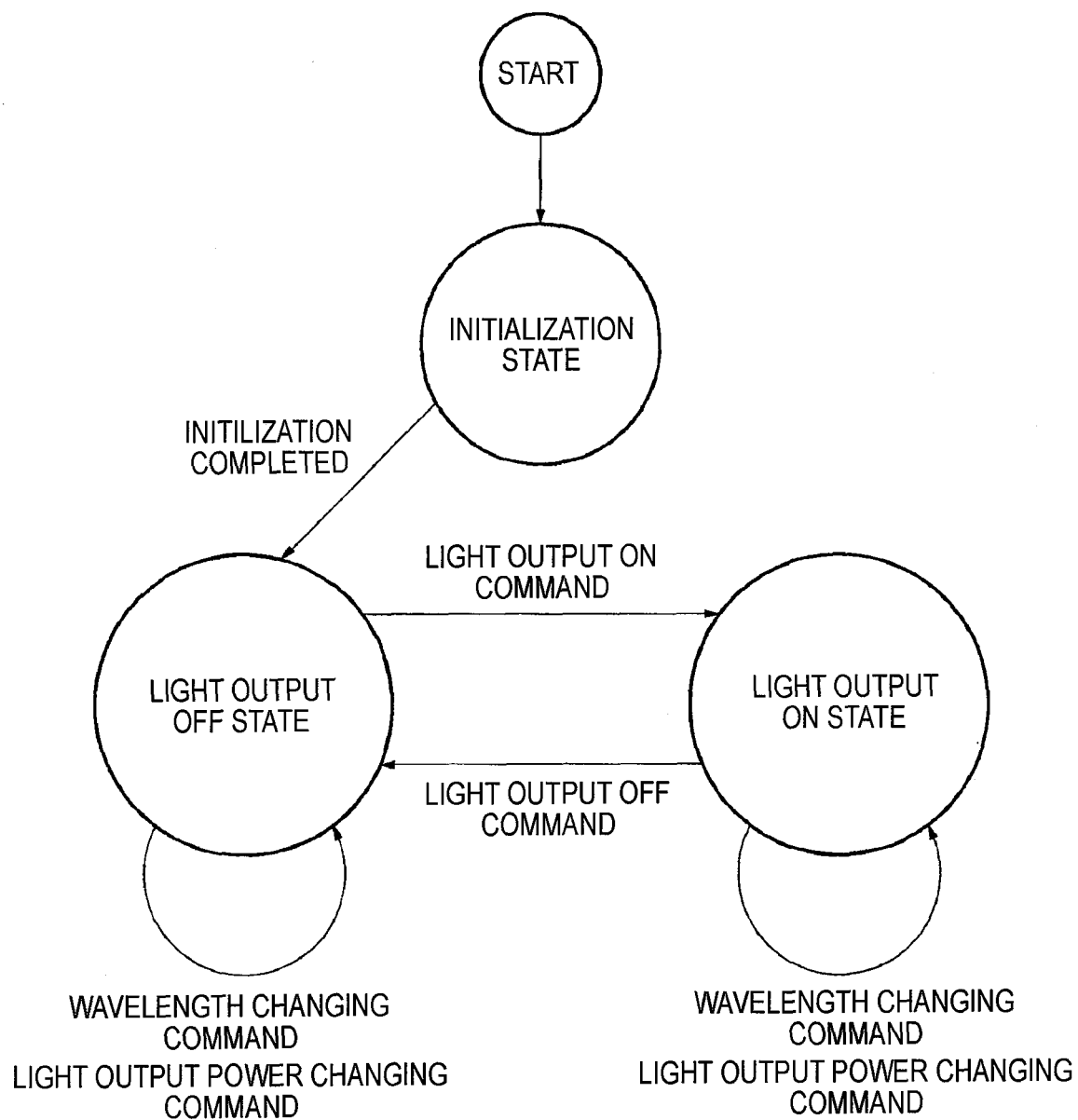
FIG. 2 is a state transition diagram of a wavelength variable light source of the invention.

FIG. 2 depicts a state transition diagram of the wavelength variable light source 1. Transitionable stable states after completing initialization are; light output OFF and light output ON states. The light output OFF state includes a state in which signal light output from the system is ignorable as the wavelength variable light source system. If the OFF state may be guaranteed, both the ATC of the TEC 9 and the ACC of the DFB laser 5 may not be implemented; however, one or the other of the ATC and the ACC may be implemented. The light output ON state means a state in which the light is outputted with desirable wavelength and desirable intensity specified from the higher-level device 3.

When the CPU 20 receives a command for changing the output wavelength and output intensity of the signal light from the higher-level device 3 during the light output OFF state, the CPU 20 determines the target values (L1o/L2o, L2o, Io, To) of the operation states (L1/L2, L2, I, T) of the various controls (AWC, APC, ACC, ATC) under the procedure shown in the flowchart in FIG. 3. That is, when the higher-level device 3 specifies the target wavelength and target intensity (target light output intensity), the CPU 20 can sequentially determines the AWC target value L1o/L2o and the APC target value L2o (Steps 11 and 12) corresponding to the specified combination of the target wavelength λ(o) and target output intensity Pow(o). The CPU 20 can also determine the ACC target value Io the ATC target value To (Steps 13 and 14) corresponding to the target wavelength λ(o). The CPU 20 can also determine the target values (L1o/L2o, L2o, Io, To) by referencing to the parameter table stored in the memory 36. Although the target values are determined in order of the AWC, APC, ACC and ATC here, the determination may take place in any order of the foregoing.

Figure 7:
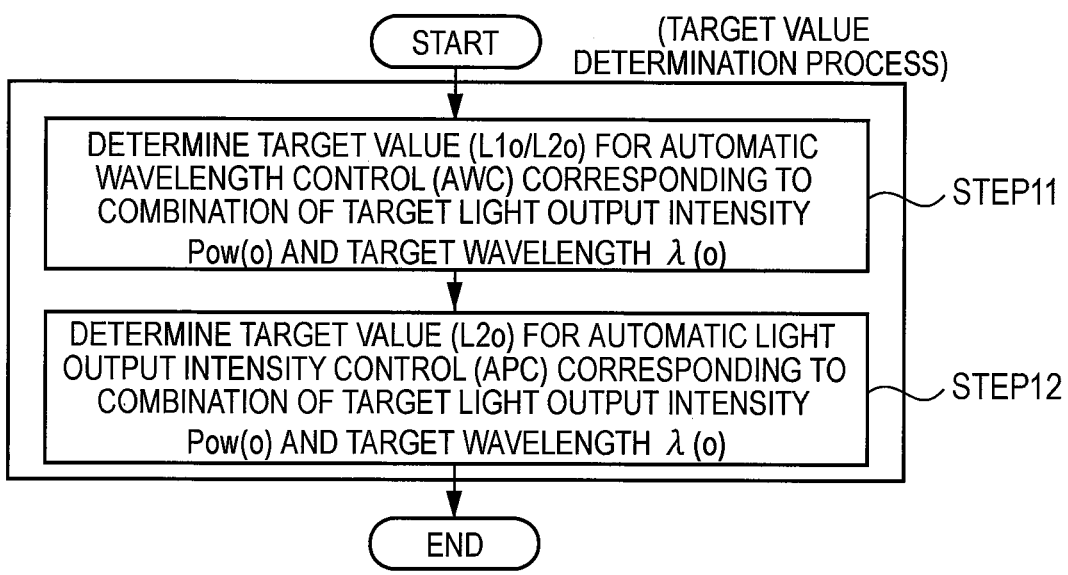
FIG. 7 is a flowchart showing a processing procedure of a target value determining process when the wavelength variable light source system of the invention receives an optical output intensity change command from the higher-level device in the state of light output OFF.

Still more, although the CPU 20 may change the four target values when it receives the command for changing the light output intensity in the example in FIG. 3, in another embodiment, only two target values related to the target output intensity Pow(o) may be updated. That is, the CPU 20 may determine only the AWC target value L1/L2 and the APC target value L2 (Steps 11 and 12). The APC target value corresponding to the combination of target wavelength λ(o) and the target output intensity Pow(o) as shown in FIG. 7.

Figure 4A:
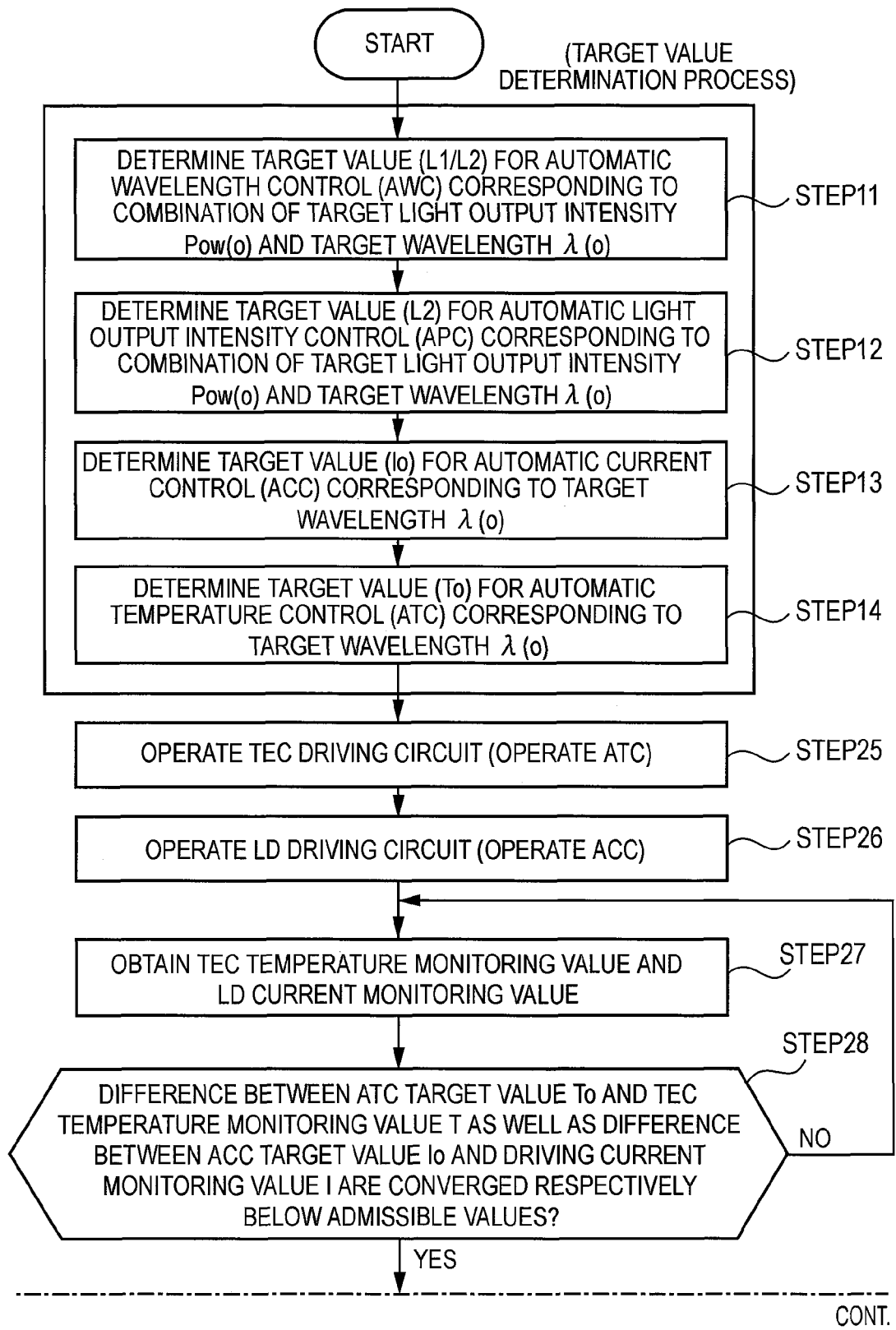
FIGS. 4a and 4b are a flowchart showing a processing procedure when the wavelength variable light source system of the invention receives an optical output ON command from a higher-level device in a state of light output OFF.
Figure 4B:
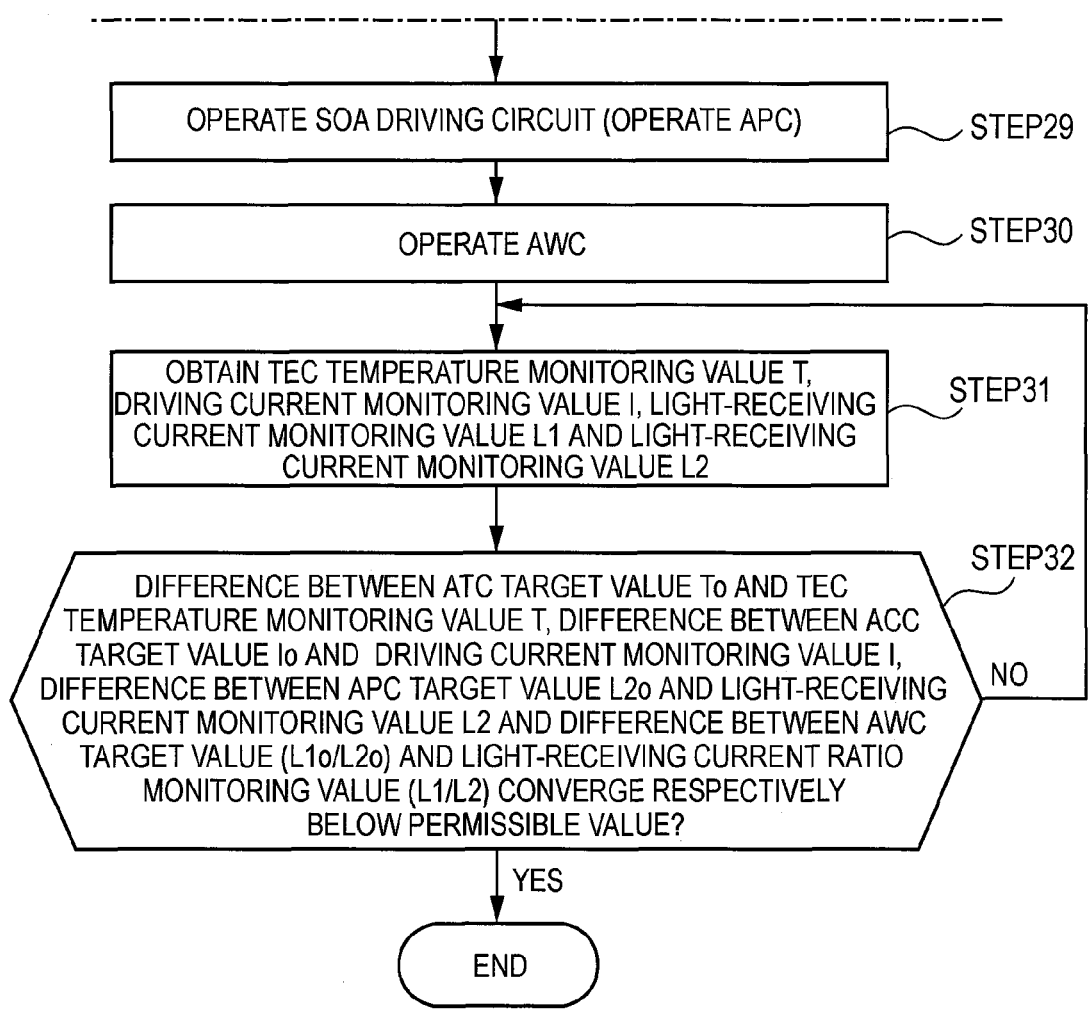

In one embodiment, when the CPU 20 receives the light output ON state during the light output OFF state, the CPU 20 transits to the light output ON state in accordance to the procedure shown in the flowchart in FIGS. 4a and 4b. The CPU 20 simultaneously determines the target values (L1o/L2o, L2o, Io, To) of the various controls (AWC, APC, ACC, ATC) corresponding to the target wavelength λ(o) and the target light output intensity Pow(o) (Steps 11 through 14). However, if the target values (L1o/L2o, L2o, Io, To) of the various controls (AWC, APC, ACC, ATC) have been already determined during the light output OFF states, the target value determination process here may not be always carried out.

After determining the target values (L1o/L2o, L2o, Io, To) of the various controls (AWC, APC, ACC, ATC), the CPU 20 operates the TEC driving circuit 25 and the LD driving current 19 (Steps 25 and 26). Then, the CPU 20 obtains the TEC temperature monitoring value T and the driving current monitoring value I (Step 27) and executes the processes of the ATC and ACC so that a difference between the ATC target value To and the TEC temperature monitoring value T as well as a difference between the ACC target value Io and the driving current monitoring value I are converged respectively below admissible values (Step 28-Step 27). Because the processes of the ATC and ACC are already being executed in the light output OFF state in this example, the automatic control is continued by changing the respective target values To and Io.

After confirming that the respective monitoring values T and I have converged to the target values To and Io in the respective control processes of the ATC and ACC (Yes in Step 28), the CPU 20 starts the APC and AWC control processes (Steps 29 and 30). Then, the CPU 20 obtains the TEC temperature monitoring value T, driving current monitoring value I, light-receiving current monitoring value L1 of the output signal component of the specific wavelength and light-receiving current monitoring value L2 of the whole output signal light (Step 31) and executes the control processes of the ATC, ACC, APC and AWC so that a difference between the ATC target value To and the TEC temperature monitoring value T, a difference between the ACC target value Io and the driving current monitoring value I, a difference between the APC target value L2o and the intensity monitoring value L2 and a difference between the AWC target value L1o/L2o and the light-receiving current ratio monitoring value L1/L2 converge respectively below the permissible value (Step 32 to Step 31). If all of the convergence conditions are met (Yes in Step 32), it means that the state has been transited to the light output ON state. Although the APC and AWC may be executed the same time, the AWC may also be executed after when the APC is converged. Still more, the ATC and the AWC are operated in the same time, a method of stopping the ATC during when the AWC is executed may be adopted.

Figure 5A:
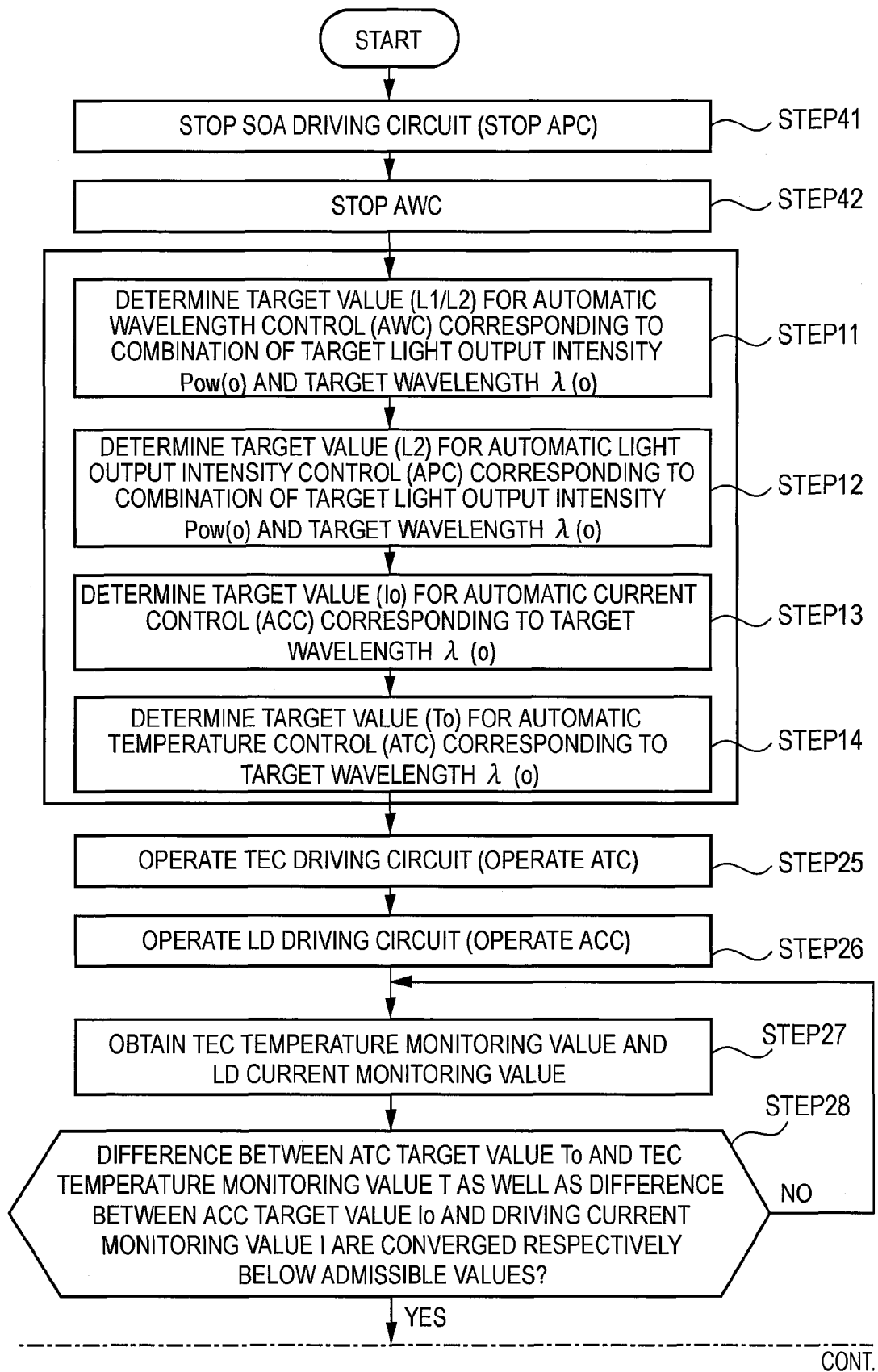
Figure 5B:
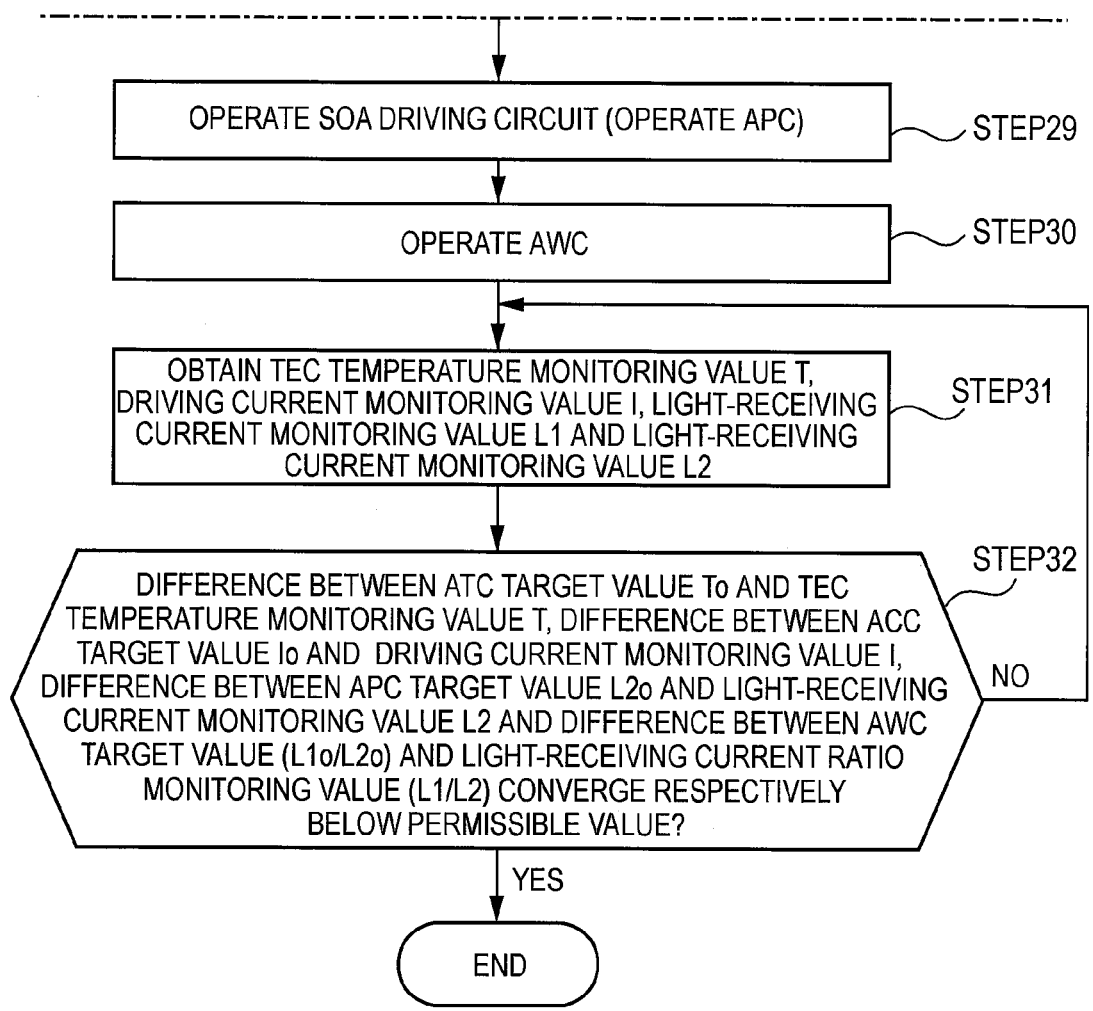

When the CPU 20 receives the wavelength changing command and the light output power changing command during the light output ON state, the CPU 20 may switch to the light output ON state by determining and controlling the target values (L1o/L2o, L2o, Io, To) of the various controls (AWC, APC, ACC, ATC) with the procedure shown in the flowchart in FIGS. 5a and 5b. In FIGS. 5a and 5b, the control processes of the APC and AWC are halted in this order before executing the target value determining process (Steps 11 through 14) in Steps 41 and 42. This is a countermeasure for suppressing emission of signal light other than the impermissible specified wavelength. If the light output intensity is not yet ignorable, the CPU 20 adapts to this by halting the ACC control process before halting the AWC (Step 42).

Figure 6:
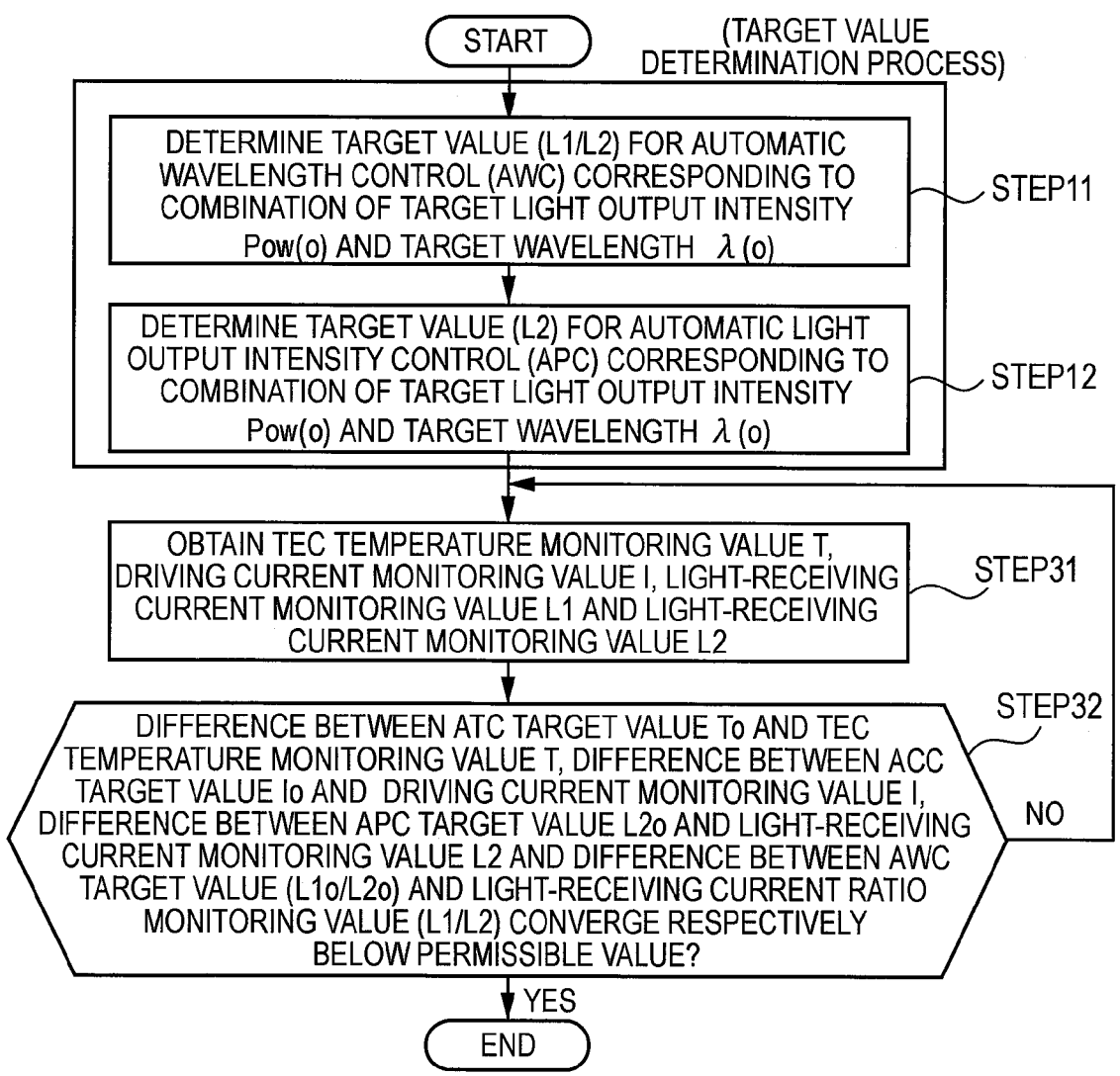

In another embodiment of the output wavelength during the light output intensity changing process, the CPU 20 may execute the target value determining process (Steps 11 through 14) without halting the APC and AWC control processes when the CPU 20 receives the light output intensity changing command from the higher-level device 3 during the light output ON state. That is, the CPU 20 carries out the control processes with the procedure shown in the flowchart in FIG. 6.

Figure 8:
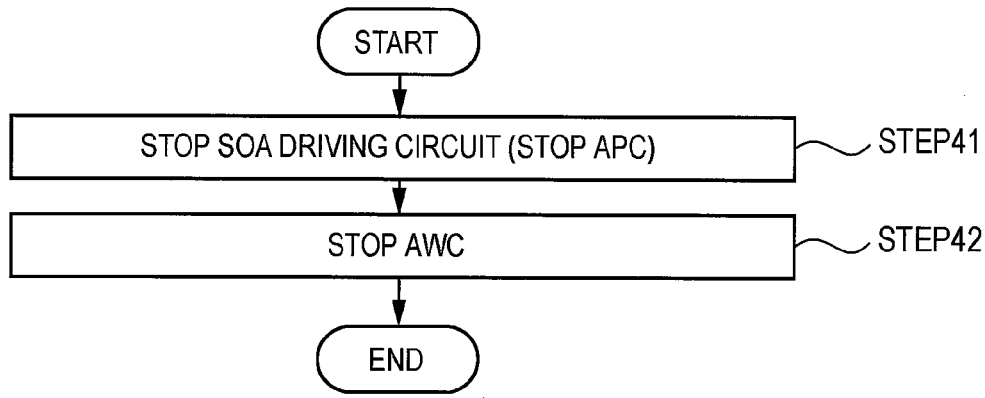

In an embodiment, when the CPU 20 receives the light output OFF command from the higher-level device 3 during the light output ON state, the CPU 20 halts the APC and AWC control processes according to the procedure shown in the flowchart in FIG. 8. The process switches the state to the light output OFF state. This switching may act as a counter measure for not outputting the signal light other than the desirable wavelength to the outside during the transition to the light output OFF state. When a light output level is not negligible just by halting the APC, the CPU 20 accommodates by halting the ACC of the DFB laser 5 before halting the AWC.

Thus, the CPU 20 may determine the target values of the various control processes, i.e., the AWC target value L1$o$/L2$o$, APC target value L2$o$, ACC target value Io and ATC target value To, by the combination of the target wavelength and the target light output intensity, so that it becomes possible to suppress the influence of heat and scattered light generated within the wavelength variable light source module and to assure the setting accuracy and stability of the output wavelength and light output intensity required for the wavelength variable light source.

The effect of the target value determining process (Steps 11 through 14) illustrated in the above mentioned cases may not change even if it is appropriately modified in the one or more control methods enumerated below.

Figure 9:
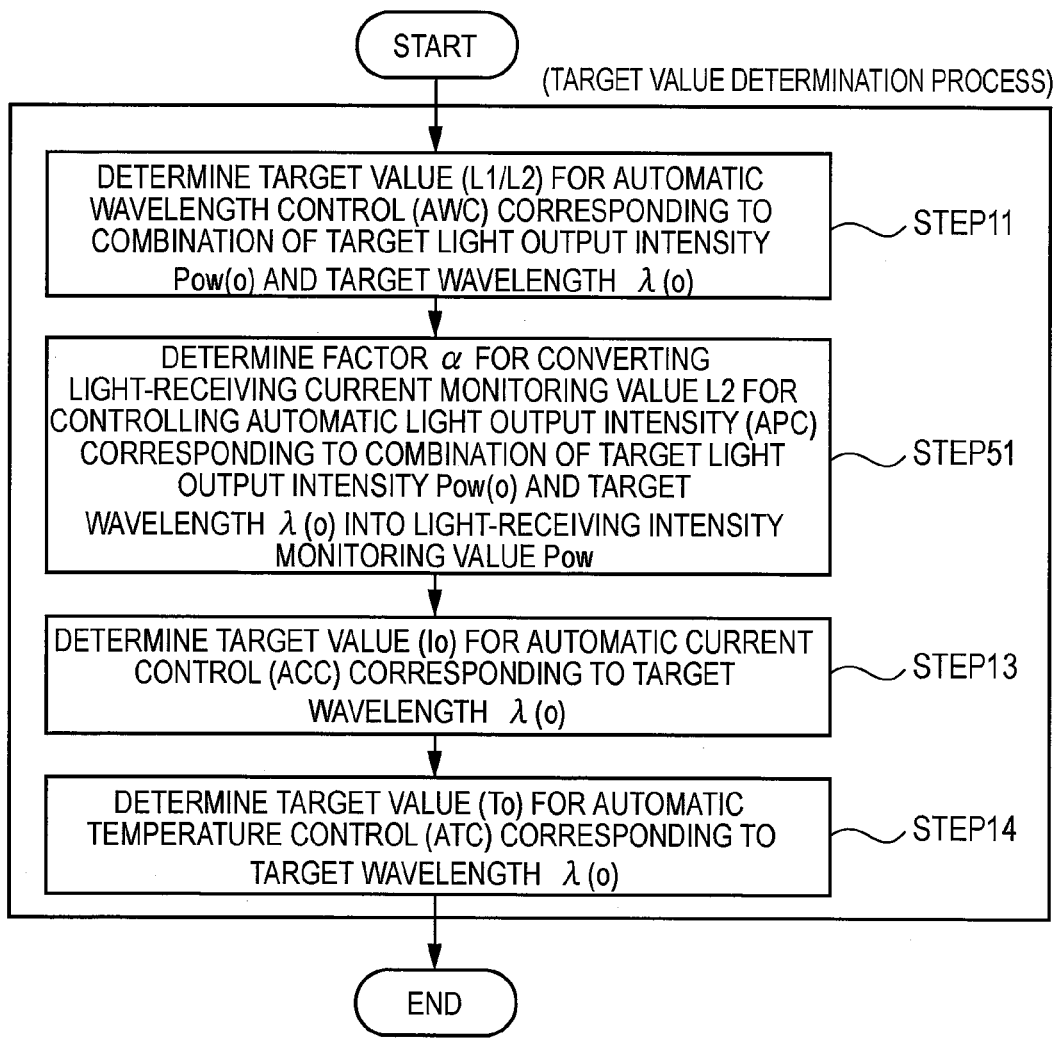
FIG. 9 is a flowchart showing another processing procedure of the target value determining process.

When the APC for controlling the light-receiving intensity of the second PD (PD2) 11-2 is adopted, and the APC of controlling the current monitoring value L2 is not adopted, the factor $\alpha$ ($\lambda(o)$, Pow($o$)) may be updated to convert the current monitoring value L2 into the light output intensity monitoring value Pow($o$) as shown in FIG. 9 (Step 12-2). This conversion factor is uniquely determined by a combination of the target wavelength $\lambda(o)$ and the target light output intensity Pow($o$) as shown in Equation 1. Accordingly, it is possible to deal with this case by storing a conversion factor table in which the combination the target wavelength $\lambda(o)$ and the target light output intensity Pow($o$) is correlated with the conversion factor a ($\lambda(o)$, Pow($o$)) in advance and of determining the conversion factor a ($\lambda(o)$, Pow($o$)) corresponding to the combination the target wavelength $\lambda(o)$ and the target light output intensity Pow($o$) by referencing the conversion factor correction table. Thus, it may be possible to reduce a load of the CPU 20 by adopting the table reference system more than the case of sequentially calculating the conversion factor by using Equation 1: light output intensity monitoring value: Pow=a (40), Pow(0))×L2.

Figure 10:
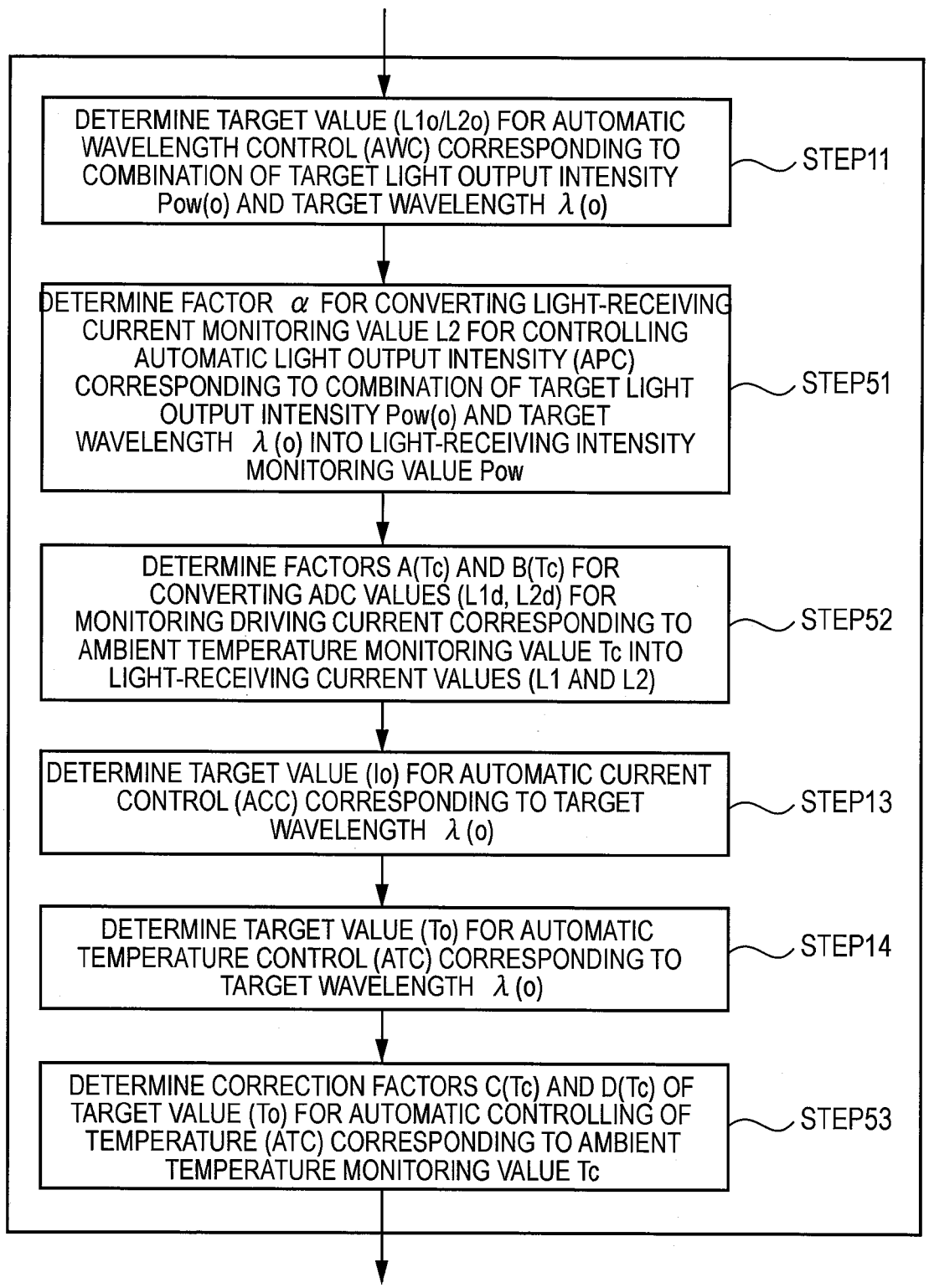
FIG. 10 is a flowchart showing a still other processing procedure of the target value determining process.
Figure 11:
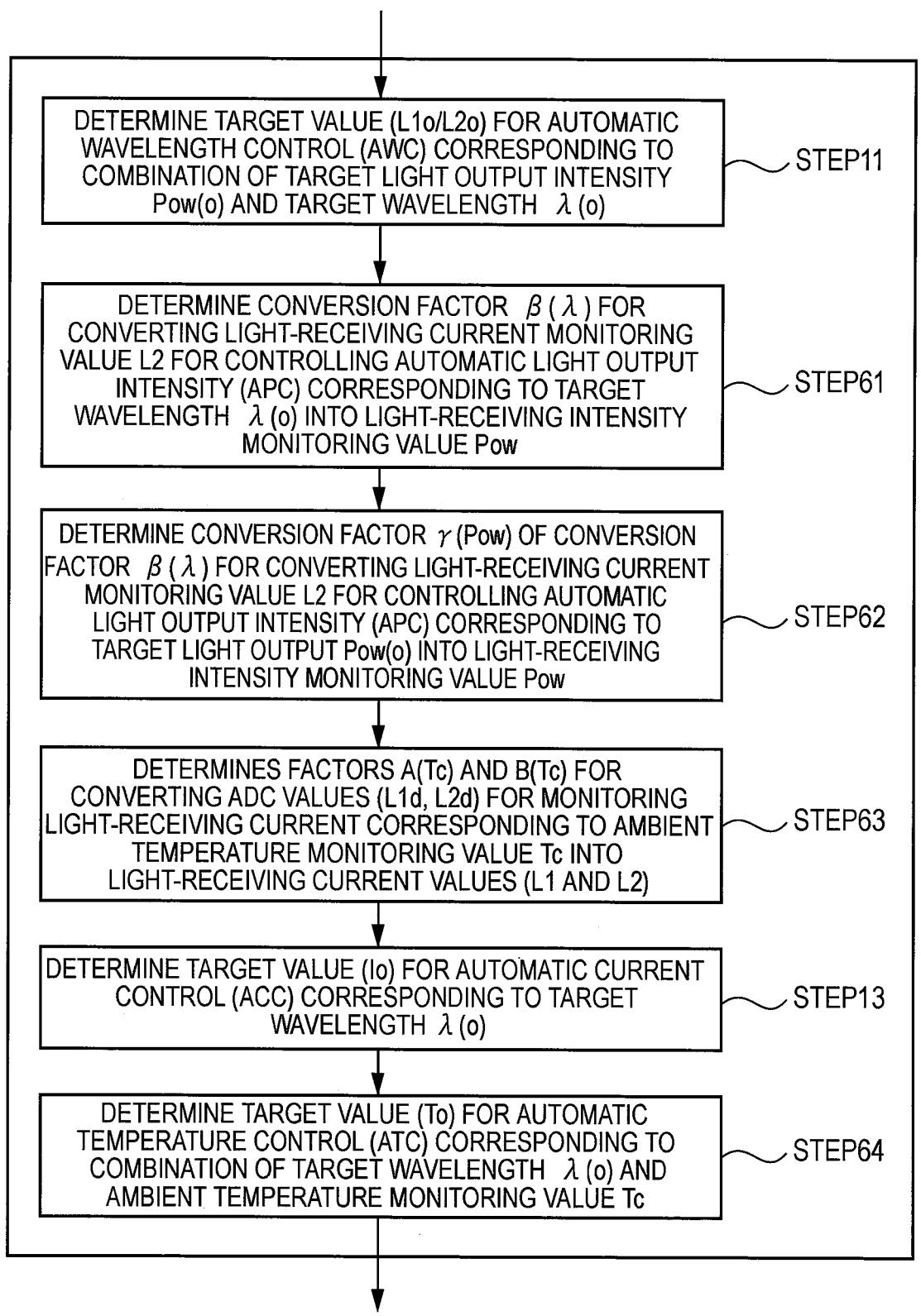
FIG. 11 is a flowchart showing a different processing procedure of the target value determining process.

The current monitoring values L1, L2 and the TEC temperature T corresponding to light-receiving intensity of the respective PD (PD1) 11-1 and PD (PD2) 11-2 may fluctuate depending on the operation ambient temperature. In this case, it is possible to suppress the ambient temperature dependency by adopting a method (see Steps 51 through 53) of determining conversion factors A(Tc) and B(Tc) for converting the output value L2$d$ of the ADC 29 into a current monitoring value L2 and conversion Factors C(Tc) and D(Tc) for correcting the TEC temperature To based on the ambient temperature Tc as shown in FIG. 10. As a result, the wavelength variable light source 2 may be operated stably and with high precision.

Conversion factors may be uniquely determined by the ambient temperature Tc as shown in Equations 2 and 3. It is possible to deal with this by adopting a method of storing a conversion factor table in which the ambient temperature Tc is correlated with the respective conversion factors A(Tc), B(Tc), C(Tc) and D(Tc) in the memory 36 and of determining the conversion factors A(Tc), B(Tc), C(Tc) and D(Tc) corresponding to the current ambient temperature Tc by referencing the conversion factor correction table. It may be possible to reduce the load of the CPU 20 by adopting the table reference system instead of merely sequentially calculating the conversion factors by using Equations 2 and 3. It may also be possible to deal with the case when a relationship of the output values L2$d$ and Td of the ADCs 29 and 32 with physical values (actual light-receiving intensity of the PD2, actual ambient temperature) is not linear by arranging such that the conversion itself is the table reference system. Current monitoring value: L2=A(Tc)×L2$d$+B(Tc) . . . (2) TEC target temperature: To=C(Tc)×Td+D(Tc) . . . (3)

Further, in the case of the control method of using the Equation 1 of converting the current monitoring value L2 into the light-receiving intensity Pow, arrangements for compensating a target wavelength dependency of a factor $\beta(\lambda)$ for converting the current monitoring value L2 into the light-receiving intensity Pow and an arrangement of compensating a target light output intensity dependency of a factor $\lambda$(Pow) that corrects the light-receiving intensity Pow are both used (see Steps 61 and 62). As a result, the wavelength variable light source 2 may be operated stably in high precision.

These factors are uniquely determined by the target wavelength $\lambda(o)$ and the target light output intensity Pow($o$) simultaneously as shown in Equation 4. The conversion factor $\beta(\lambda)$ and the correction factor $\lambda$(Pow) in Equation 4 are what the conversion factor $\alpha$ ($\lambda$, Pow) in Equation 1 is divided by. In such an instant, it is possible to store a wavelength dependent factor table in which the target wavelength $\lambda(o)$ is correlated with the conversion factor $\beta(\lambda)$ and a correction factor table in which the target light output intensity Pow($o$) is correlated with the correction factor $\lambda$(Pow) in the memory 36, by determining the conversion factor $\beta(\lambda)$ corresponding to the target wavelength $\lambda(o)$ by referencing the wavelength dependent factor table, and by determining the correction factor $\lambda$(Pow) corresponding to the target light output intensity Pow($o$) by referencing the correction factor table and by using a value obtained by multiplying the conversion factor $\beta(\lambda)$ with the correction factor $\lambda$(Pow) as a conversion factor $\alpha(\lambda(o)$, Pow($o$)). Application of these conversion tables may be more efficient than Equation 1 because a volume of the tabled conversion factors and correction factors may be compressed. Light output intensity monitoring value: Pow=$\beta(\lambda)$×$\gamma$(Pow)×L2 . . . (4)

As described above, it is possible to assure the high precision and stable operation of the wavelength variable light source 2 by appropriately adjusting the target value determining process corresponding to the control method of the wavelength variable light source 2. In short, the target values (L1$o$/L2$o$, L2$o$, Io, To) of the various controls (AWC, APC, ACC, ATC), the conversion factors and correction factors of the monitoring values may be adjusted corresponding to the combination of the target wavelength $\lambda(o)$ and the target light output intensity Pow($o$) simultaneously.

Further, when the influence of the ambient temperature is not ignorable, the CPU 20 adjusts the target values of the various controls (AWC, APC, ACC, ATC), the conversion factors and correction factors the monitoring values (Steps 63 and 64). This may be achieved by correlating with one or more of the ambient temperature Tc, the target wavelength λ(o), and the target light output intensity Pow(o). As a result the wavelength variable light source 2 may be operated stably in higher precision.

It is noted that although the above mentioned embodiment has been explained using the case of using the DFB laser as the semiconductor laser, the present invention is not limited by the DFB laser and may be realized by using the DBR laser.

The following points may be different in embodiments using the DBR laser instead of the DFB laser. When the DFB laser is used, the AWC may be realized by updating the control instruction value of the TEC driving circuit 25, whereas the control instruction value of the LD driving current 19 may be updated when the DBR laser is used. Therefore, when the DBR laser is used, the control instruction value of the LD driving current 19 is updated in the both ACC and AWC of the DBR laser, so that a method of using the both ACC and AWC or a method of selecting one of them may be adopted.

As another example, the ACC of the DFB laser is independently operated when the DFB laser is used, whereas the ATC of the TEC 9 is independently operated when the DBR laser is used.

In another embodiment, although the control based on the ratio (ratio of intensity: L1/L2) of the signal light of specific wavelength component contained in the whole output signal light of the DFB laser 5 is carried out in the LD temperature control loop 15, the output wavelength control based on the intensity of the output signal light component of the specific wavelength and the output intensity control based on the intensity of the whole output signal light may be respectively independently carried out or used in combination with the output wavelength control based on the TEC temperature monitoring value T.

Further, although in one embodiment the control (APC) based on the whole output signal light of the DFB laser 5 amplified by the SOA 6 is carried out in the SOA driving current control loop 6, the control (ACC) based on the driving current of the SOA 6 may be used not at all or in one or more of the APC.

Still more, the AWC of the DFB laser 5 may be used in combination with the ATC of the TEC 9 or either one of them may be selectively carried out.

Figure 12:
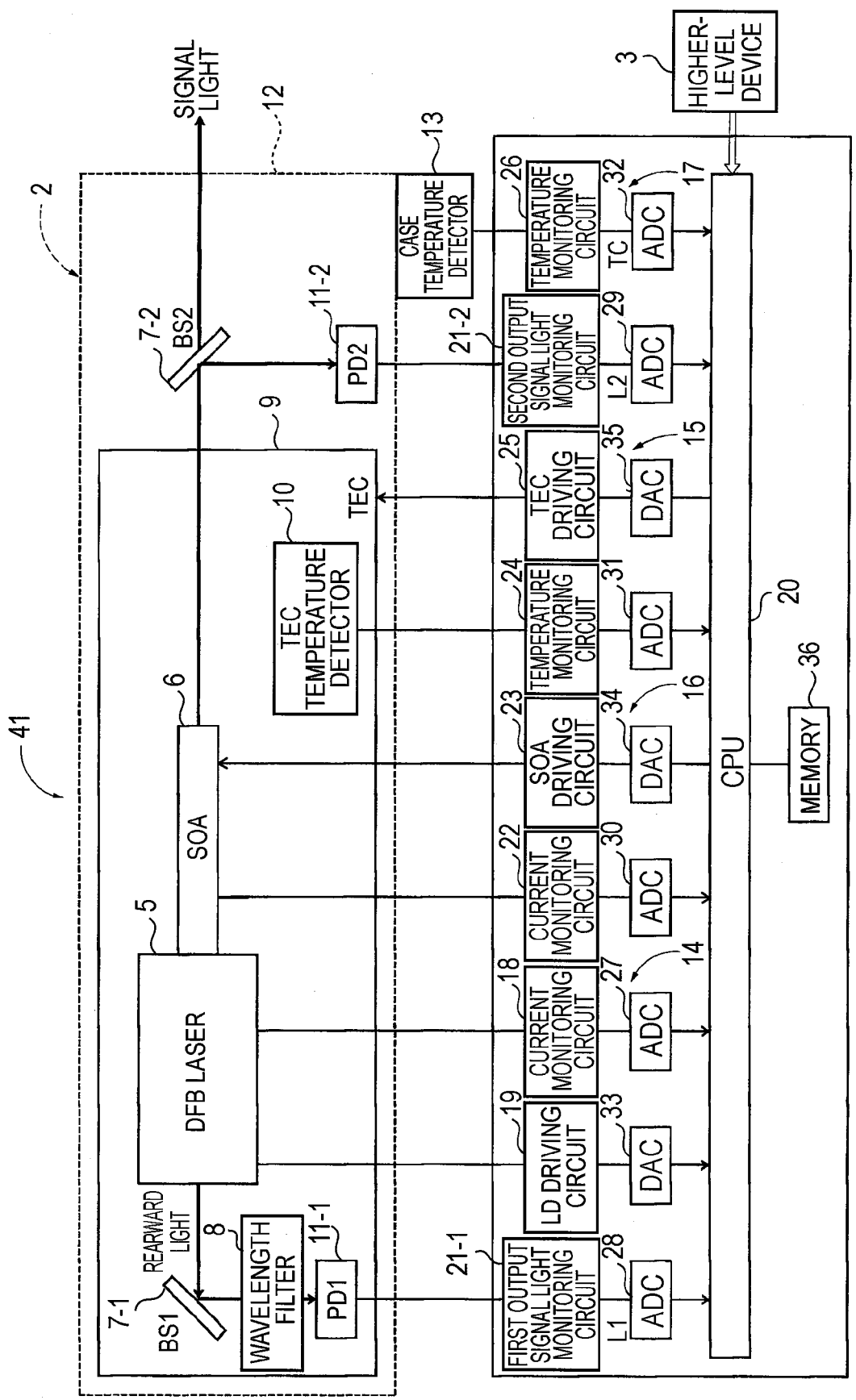
FIG. 12 is a block diagram showing another exemplary configuration of the wavelength variable light source system of the invention.

FIG. 12 is a block diagram showing another exemplary configuration of the wavelength variable light source system. In which the wavelength variable light source system 41, the first BS 7-1 is provided on a rearward output optical axis of the DEB laser 5. In FIG. 12 the first BS 7-1, the wavelength filter 8, and the first PD 11-1 may be mounted on the TEC 9 together with the DFB laser 5.

In an embodiment, the wavelength variable light source system 41 is different from the wavelength variable light source system 1 shown in FIG. 1 in that monitoring of output wavelength of the DFB laser 5 is carried out by using rearward light of the DFB laser 5. Other aspects and embodiments noted above with respect to FIG. 1 may remain the same. For example, converging the wavelength and intensity of output signal light of the control circuit 4 to the target wavelength and target light output intensity may be the same. It is possible to realize high precision and stable wavelength variable light source by applying the target value determining process accommodated to the target wavelength λ(o), target light output intensity Pow(o) and the ambient temperature Tc by applying the state transition chart and flowcharts shown in FIGS. 3 through 11 to FIG. 12.

It is noted that although the optical parts for monitoring the rearward light of the DFB laser 5, are mounted on the TEC 9 in the exemplary configuration of FIG. 12, it is not necessary to dispose those optical parts on the TEC 9.

Figure 13:
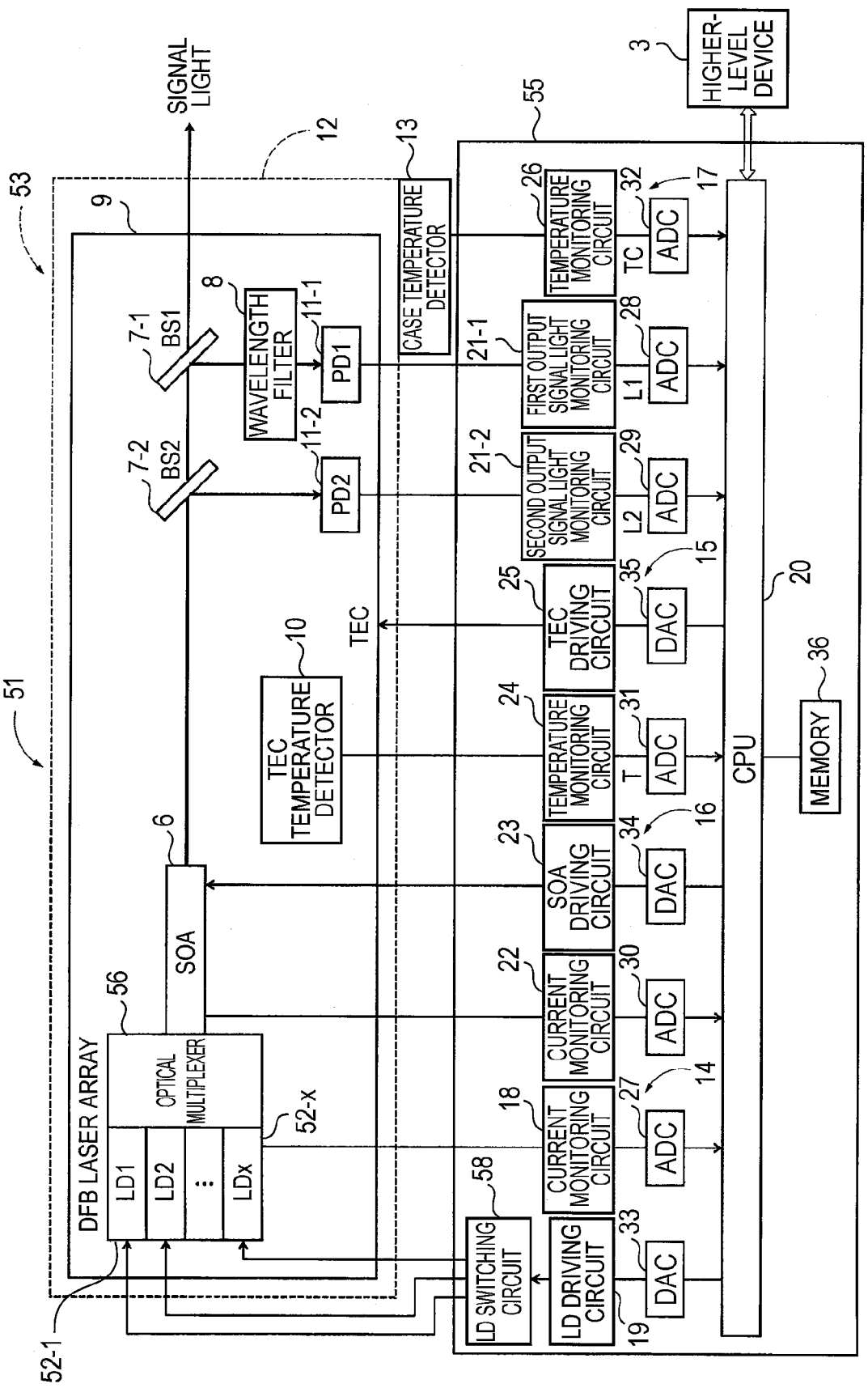
FIG. 13 is a block diagram showing a still other exemplary configuration of the wavelength variable light source system of the invention.

FIG. 13 is a block diagram showing a still other exemplary configuration of the wavelength variable light source system of the invention. The wavelength variable light source system 51 has a wavelength variable light source 53 using a DFB laser array 52 as a signal light sending source and a control circuit 55 that controls the wavelength variable light source 53 in accordance to instructions from the higher-level device 3. The DFB laser array 52 is composed of a plurality of arrayed DBR laser devices 52-1 through 52-x whose output bands are different from each other. An optical multiplexer 56 provided at an output portions can expand a wavelength variable range considerably by selectively driving one of the DFB laser devices 52-1 through 52-x.

In an embodiment, the wavelength variable light source 53 has the DFB laser array 52, the SOA 6 for amplifying output signal light of the DFB laser array 52, first and second BSs 7-1 and 7-2 provided on the optical axis of the SOA 6, the temperature dependent wavelength filter 8 provided on the split side optical axis of the first BS 7-1, and the TEC 9 mounting the above. The TEC 9 comprises a TEC temperature detector 10. The PDs 11-1 and 11-2 are provided respectively on the output optical axis of the wavelength filter 8 and the split side optical axis of the second BS 7-2. These are stored within the same case 12 indicated by a broken line. The case 12 is provided with a case temperature detector 13 for detecting temperature (ambient temperature: Tc) of the case 12. The structure of the wavelength variable light source 53 may be different from that noted above with respect to FIG. 1 because, among other things, the DFB laser array 52 is used as the semiconductor laser and that the optical parts for monitoring the output signal light, i.e., the first and second BSs 7-1 and 7-2, the wavelength filter 8 and the PDs 11-1, and 11-2 are mounted on the TEC 9.

In an embodiment, the control circuit 55 comprises a LD driving current control loop 14 for controlling the driving current of the DFB laser array 52, the LD temperature control loop 15 for controlling temperature of the DFB laser array 52, and the wavelength filter 8. The control circuit 55 may further comprise the SOA driving current control loop 16 for controlling the driving current of the SOA 6 and the ambient temperature dependency suppressing circuit 17. The structure of the control circuit 55 may be different from the control circuit discuss above in that the LD driving current control loop 14 comprises a LD switching circuit 58 for selectively driving one of the DFB laser devices 52-1 through 52-x. As another example difference, when a target wavelength is specified by the higher-level device 3, the LD driving current control loop 14 selectively switches the DFB laser devices 52-1 through 52-x corresponding to the target wavelength λ(o) to shift the light. The LD switching circuit 58 operates according to a switching signal from the CPU 20. The control for switching the DFB laser devices 52-1 through 52-x may be handled by storing in the memory 36, a table comprising both the target wavelength λ(o) and the DFB laser devices 52-1 through 52-x to be selected. The respective DFB laser devices 52-1 through 52-x may be alternatively driven and the plurality of devices need not be driven simultaneously, so that the control of the LD driving current 19 may be carried out as described above with respect to FIG. 1.

The control method similar to that described with respect to FIG. 1 may be applied also in the wavelength variable light source system 51. That is, the highly accurate and stable wavelength variable light source may be realized by applying the target value determining process correlated with the target wavelength λ(o), target light output intensity Pow(o) and TEC temperature Tc by using the state transition chart and the flowcharts shown in FIGS. 3 through 11.

Still more, the wavelength variable light source system 51 may mount the optical parts for monitoring the output signal light on the TEC 9, to improve the durability of those optical parts against changes of ambient temperature. Further, because the temperature of the wavelength filter 8 may be controlled, a wavelength filter 8 having large temperature dependency may be adopted.

Figure 14:
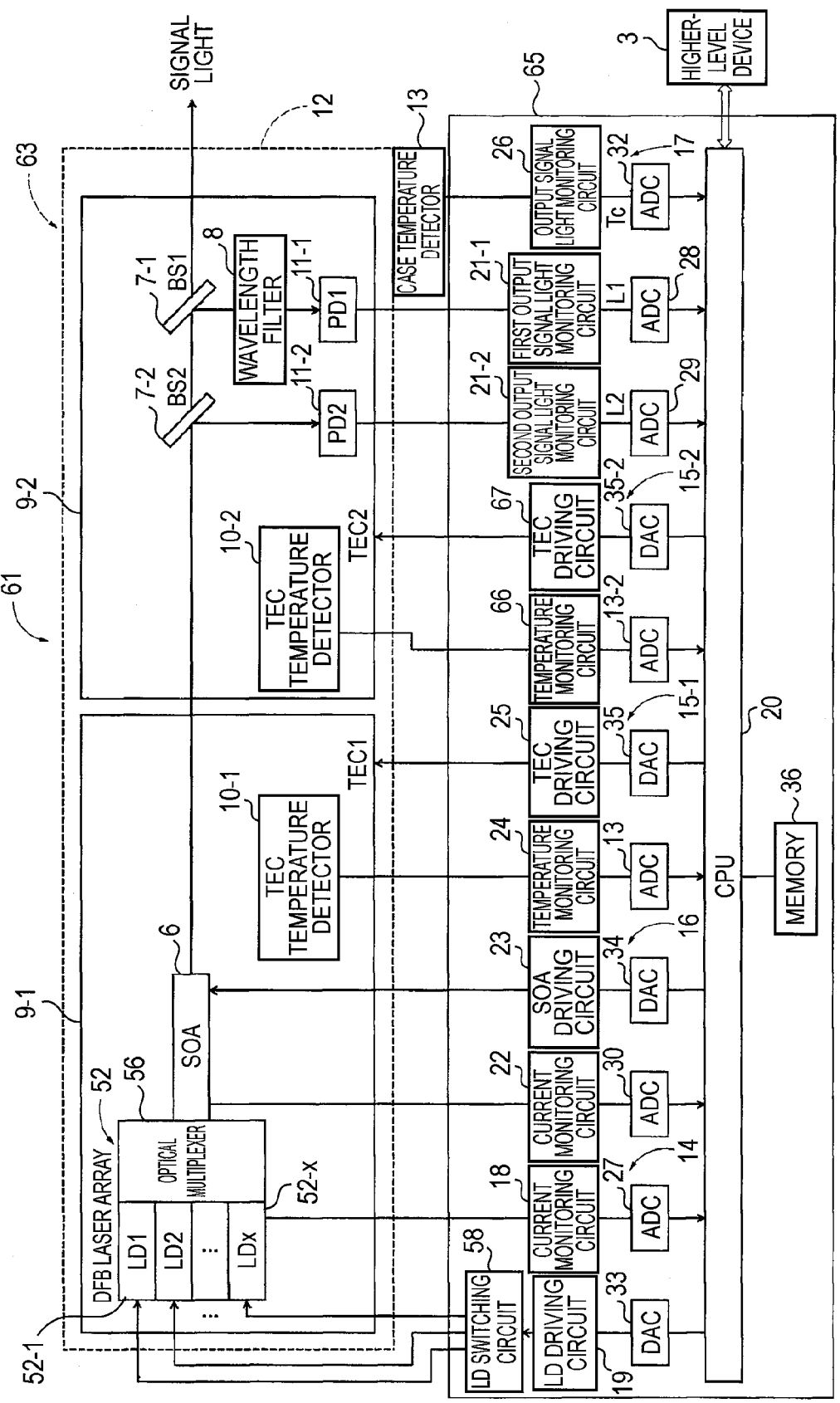
FIG. 14 is a block diagram showing a different exemplary configuration of the wavelength variable light source system of the invention.

FIG. 14 is a block diagram showing a different exemplary configuration of the wavelength variable light source system 61 that comprises wavelength variable light source 63 using the DFB laser array 52 as the signal light sending source and a control circuit 65 for controlling the wavelength variable light source 63 according instructions from the higher-level device 3.

As shown in FIG. 14, the wavelength variable light source 63 may comprise DFB laser array 52, the SOA 6 for amplifying output signal light of the DFB laser array 52, first and second BSs 7-1 and 7-2 provided on the optical axis of the SOA 6, the temperature dependent wavelength filter 8 provided on the split side optical axis of the first BS 7-1 and first and second TECs 9-1 and 9-2. The PDs 11-1 and 11-2 may be provided respectively on the output optical axis of the wavelength filter 8 and the split side optical axis of the second BS 7-2. The DFB laser array 52 and the SOA 6 can be mounted on the first TEC 9-1. The first and second BSs 7-1 and 7-2, the wavelength filter 8 and the PDs 11-1 and 11-2 are mounted on the second TEC 9-2. Accordingly, TEC temperature detectors 10-1 and 10-2 may be provided respectively in the first and second TECs 9-1 and 9-2. These may be stored within the same case 12 as indicated by a broken line. The case 12 may comprise the case temperature detector 13 for detecting temperature (ambient temperature: Tc) of the case 12. The structure of the wavelength variable light source 63 may be configured such that the first TEC 9-1 for controlling temperature of the DFB laser array 52 and the second TEC 9-2 for controlling the wavelength filter 8 are provided so that the respective TEC temperatures may be independently controlled.

The control circuit 65 comprises the LD driving current control loop 14 for controlling the driving current of the DFB laser array 52, a LD temperature control loop 15-1 for controlling the temperature of the DFB laser array 52, and a temperature control loop 15-2 for controlling temperature of the wavelength filter 8. The control circuit may further comprise the SOA driving current control loop 16 for controlling the driving current of the SOA 6 and the ambient temperature dependency suppressing circuit 17. The structure of the control circuit 65 is provided with the LD temperature control loop 15-2.

In FIG. 14, the LD temperature control loop 15-2 has a temperature monitoring circuit 66 for monitoring the temperature of the wavelength filter 8 based on an output of the TEC temperature detector 10-2, a TEC driving circuit 67 for driving the second TEC 9-2 and the CPU 20. An output signal of the temperature monitoring circuit 66 may be converted into a digital signal by the ADC-2 and sent to the CPU 20. The TEC temperature control signal outputted from the CPU 20 may be converted into an analog signal by the DAC 35-2 and inputted to the TEC driving circuit 67.

In one embodiment of the LD temperature control loop 15-2, the CPU 20 functions as a digital control circuit for outputting the TEC temperature control signal for controlling temperature of the wavelength filter 8 based on an output of the temperature monitoring circuit 66. That is, the CPU 20 receives the output of the temperature monitoring circuit 66 as a TEC temperature monitoring value and updates the TEC temperature based on the difference between the TEC temperature target value To and the TEC temperature monitoring value T. The TEC driving circuit 67 drives the second TEC 9-2 based on the TEC temperature control signal. Thereby, the ATC of the second TEC 9-2 may be realized.

It may be possible to stabilize output wavelength even if the wavelength filter 8 whose temperature dependency is not ignorable is by providing the wavelength filter 802 for controlling the temperature of the wavelength filter 8, along with the first TEC 9-1 for controlling the temperature of the DFB laser array 52, and by driving the second TEC 9-2 based on the output of the temperature monitoring circuit 66. That is, it is possible to stabilize the transmission characteristics of the periodic wavelength filter without being influenced by the temperature of the first TEC 9-1.

The control method described above with respect to FIG. 13 may also be in the wavelength variable light source system 61. That is, the highly accurate and stable wavelength variable light source may be realized by applying the target value determining process correlated with the target wavelength λ(o), target light output intensity Pow(o) and TEC temperature Tc by using the state transition chart and the flowcharts shown in FIGS. 3 through 11 upon extending the TEC temperature control loop into the two types of loops.

Figure 15:
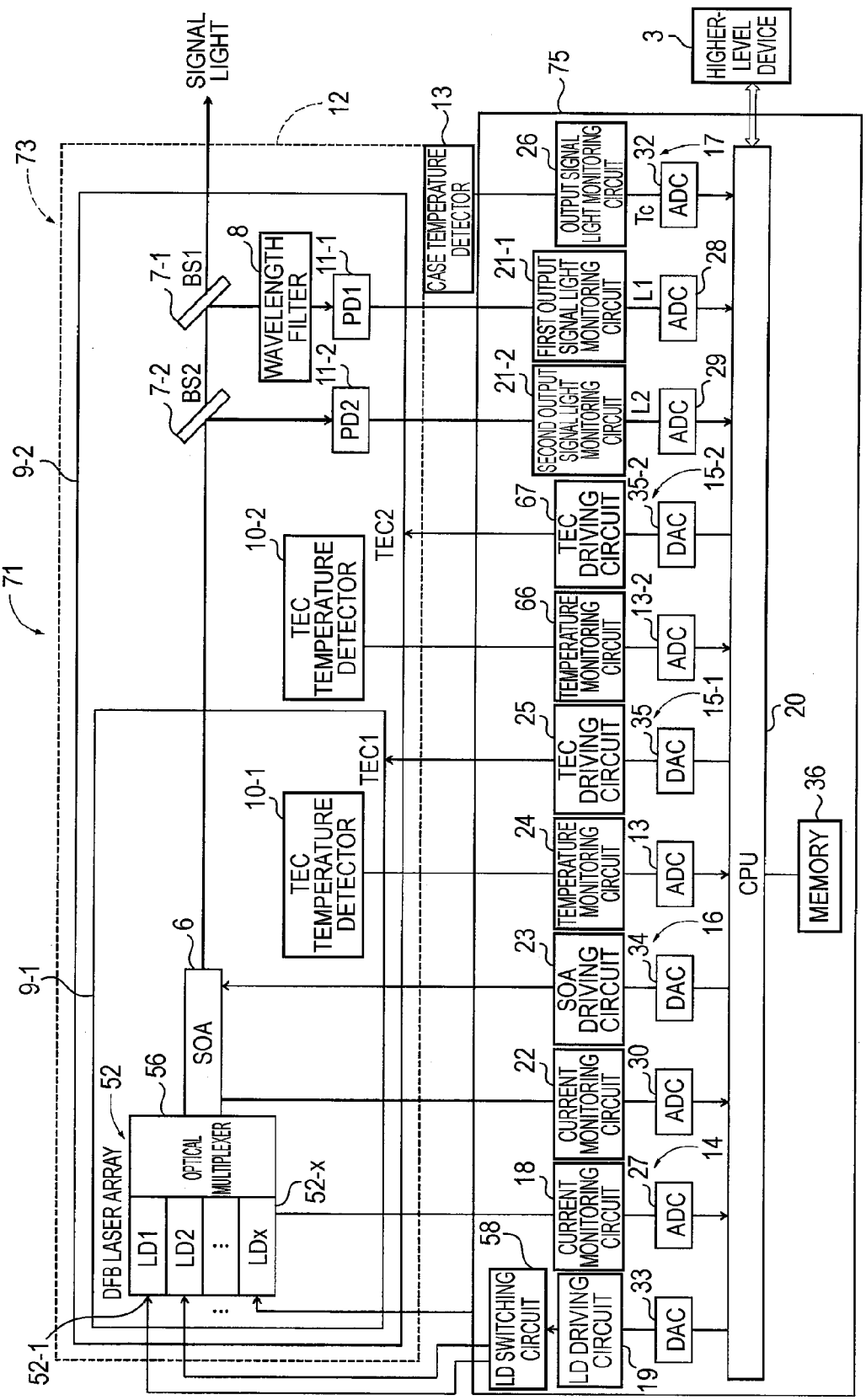
FIG. 15 is a block diagram showing a still different exemplary configuration of the wavelength variable light source system of the invention.

FIG. 15 is a block diagram showing a still different exemplary configuration of the wavelength variable light source system of the invention. The wavelength variable light source system 61 has a wavelength variable light source 63 using the DFB laser array 52 as the signal light sending source and a control circuit 65 for controlling the wavelength variable light source 63 according instructions from the higher-level device 3.

The wavelength variable light source 73 comprises the DFB laser array 52, the SOA 6 for amplifying output signal light of the DFB laser array 52, first and second BSs 7-1 and 7-2 provided on the optical axis of the SOA 6, the temperature dependent wavelength filter 8 provided on the split side optical axis of the first BS 7-1 and first and second TECs 9-1 and 9-2. The PDs 11-1 and 11-2 are provided respectively on the output optical axis of the wavelength filter 8 and the split side optical axis of the second BS 7-2. The DFB laser array 52 and the SOA 6 are mounted on the first TEC 9-1. The first and second BSs 7-1 and 7-2, the wavelength filter 8 and the PDs 11-1 and 11-2 are mounted on the second TEC 9-2. Then, TEC temperature detectors 10-1 and 10-2 are provided respectively in the first and second TECs 9-1 and 9-2. These are stored within the same one case 12 indicated by a broken line. The case 12 is provided with the case temperature detector 13 for detecting temperature (ambient temperature: Tc) of the case 12.

As depicted in FIG. 15, the wavelength variable light source system 71, the first TEC 9-1 is mounted on the second TEC 9-2. It is therefore possible to stabilize the control system by mounting the first TEC 9-1 that mounts the light emitting optical parts (the DFB laser array 52 and the SOA 6) on the second TEC 9-2 that mounts the light receiving optical parts (the first and second BSs 7-1 and 7-2, the wavelength filter 8 and the PDs 11-1 and 11-2) because the temperature control of the first TEC 9-1 based on the operation temperature of the second TEC 9-2 may be realized.

Because the structure of the FIG. 15 is similar to that of the FIG. 14, the same control method with that of FIG. 14 may be applied. The wavelength variable light source system 71. That is, the highly accurate and stable wavelength variable light source may be realized by applying the target value determining process correlated with the target wavelength λ(o), target light output intensity Pow(o) and TEC temperature Tc by using the state transition chart and the flowcharts shown in FIGS. 3 through 11.

What is claimed:

1. A wavelength variable light source system, comprising:
    a wavelength variable light source having a wavelength variable semiconductor laser that emits signal light and an optical amplifier that amplifies the output signal light of said wavelength variable semiconductor laser;
    a control circuit for controlling said wavelength variable semiconductor laser and said optical amplifier;
    a first beam splitter provided on the optical axis of said optical amplifier;
    a first photo diode provided on the split-side optical axis of said first beam splitter;
    a second beam splitter provided on an optical axis of said optical amplifier;
    a wavelength filter provided on a split side optical axis of the first beam splitter;
    a second photo diode provided on the split-side optical axis of the second beam splitter;
    wherein the control circuit converges a wavelength and an intensity of the output signal light of said wavelength variable light source to a target wavelength value and a target intensity value,
    wherein said control circuit comprises:
        one or more monitoring circuits for monitoring one or more operation states including a wavelength and an intensity of the output signal light as well as a current and a temperature of the wavelength variable semiconductor laser;
        a parameter table in which a combination of said target wavelength and said target intensity is correlated with one or more target values of the operation states; and
        a conversion factor table in which a combination of a target wavelength λ(o) and a target light intensity Pow(o) are correlated by a conversion factor α(λ(o), Pow(o));
    wherein the control circuit converts a current monitoring value, L2, into a light output intensity monitoring value, Pow, based at least in part on α(λ(o), Pow(o))×L2;
    wherein the control circuit uses both an arrangement for compensating a target wavelength dependency of a conversion factor of β(λ), and an arrangement of compensating a target light output intensity dependency of a correction factor χ(Pow) to correct Pow to produce a corrected Pow;
    wherein when the control circuit receives a command for changing the target wavelength and the target intensity from a CPU control device, said wavelength variable light source system determines the one or more target values of the operation states corresponding to the combination of the target wavelength and the target intensity in accordance with said parameter table;
    wherein the wavelength variable light source system controls the wavelength variable light source so that the one or more operation states monitored by output values of the monitoring circuits converge to the target values of the one or more operation states;
    wherein said control circuit determines a target value for controlling wavelength and a target value for controlling light output intensity based on the one or more target values of said operation states;
    wherein determining said target value for controlling the light output intensity includes at least one of, the driving current of said optical amplifier, a light-receiving current of said first photo diode, and a light-receiving intensity of said first photo diode; and
    wherein determining said target value for controlling the wavelength includes a ratio between the light-receiving current of the first photo diode and a light-receiving current of the second photo diode and a ratio between light-receiving intensity of the first photo diode and a light-receiving intensity of the second photo diode.

2. The wavelength variable light source system according to claim 1, wherein said control circuit comprises:
    a monitoring circuit for monitoring the ambient temperature; and
    a target value correction table correlating the ambient temperature and a correction value of the target value of the operation state,
    wherein when the control circuit receives a command for changing the target wavelength and the target intensity from a CPU control device, said control circuit determines the target value of the operation state corresponding to the specified combination of target wavelength and target intensity in accordance with said parameter table;
        determines the correction value of the target value of the operation state corresponding to the ambient temperature at that moment by referencing the target value correction table; and
        controls said wavelength variable light source so that the monitoring value of the operation state based on the output value of said monitoring circuit converges to said correction value.

3. The wavelength variable light source system according to claim 2, wherein the ambient temperature is used to determine at least one of, the target value for controlling wavelength, and the target value for controlling the light output intensity.

4. The wavelength variable light source system according to claim 1, wherein said control circuit comprises an AD conversion circuit provided per each monitoring circuit,
    wherein the AD conversion circuit converts the output value of said monitoring circuit into a digital signal;
    wherein the AD conversion circuit determines at least one of; a monitoring value conversion factor for controlling wavelength, and a monitoring value conversion factor for controlling light output intensity by correlating with said combination of target wavelength and target intensity; and
    wherein the AD conversion circuit controls said wavelength variable light source so that the value converted from an output value of said AD conversion circuit by said monitoring value conversion factor converges to said target value.

5. The wavelength variable light source system according to claim 4, wherein said control circuit has a conversion factor table correlating said combination of said target wavelength and target intensity with said monitoring value conversion factor; and
    wherein when the control circuit receives a command for changing the target wavelength and the target intensity from a CPU control device, the control circuit determines the monitoring value conversion factor corresponding to the combination of the target wavelength and target intensity in accordance with said conversion factor table.

6. The wavelength variable light source system according to claim 4, wherein said control circuit comprises:

a wavelength dependent factor table correlating said target wavelength with the wavelength dependent component of said monitoring value conversion factor; and a correction factor table correlating said target intensity with an output value correction factor of said AD converting circuit, wherein the control circuit determines the wavelength dependent component of said monitoring value conversion factor corresponding to said target wavelength based on said wavelength dependent factor table;

wherein the control circuit determines said output value correction factor corresponding to said target intensity by referencing said correction factor table; and wherein the control circuit uses a value obtained by multiplying said wavelength dependent component with said output value correction factor as said monitoring value conversion factor.

7. The wavelength variable light source system according to claim 4, wherein said control circuit comprises a monitoring circuit for monitoring the ambient temperature; and a conversion factor table correlating the ambient temperature with said monitoring value conversion factor, wherein the control circuit determines said monitoring value conversion factor corresponding to the ambient temperature by referencing said conversion factor table.

8. The wavelength variable light source system according to claim 4, wherein said monitoring value conversion factor for controlling wavelength includes at least one of:

the conversion factor for the temperature of said semiconductor laser, the conversion factor for the driving current of said semiconductor laser, the conversion factor for the light-receiving current of the first photo diode, the conversion factor for the light-receiving intensity of the first photo diode, the conversion factor for the light-receiving current of the second photo diode, and the conversion factor for the light-receiving intensity of the second photo diode.

9. The wavelength variable light source system according to claim 1, wherein said wavelength variable semiconductor laser is a semiconductor laser configured to control wavelength by adjusting its diode temperature.

10. The wavelength variable light source system according claim 1, wherein the wavelength variable semiconductor laser is a semiconductor laser configured to control wavelength by adjusting its driving current.

11. A method for operating a variable semiconductor laser, the method comprising:

providing a wavelength variable light source having a wavelength variable semiconductor laser that emits signal light and an optical amplifier that amplifies the output signal light of said wavelength variable semiconductor laser;

providing a control circuit for controlling said wavelength variable semiconductor laser and said optical amplifier;

providing a first beam splitter provided on the optical axis of said optical amplifier;

providing a first photo diode provided on the split-side optical axis of said first beam splitter;

providing a second beam splitter provided on an optical axis of said optical amplifier;

providing a wavelength filter provided on a split side optical axis of the first beam splitter; and providing a second photo diode provided on the split-side optical axis of the second beam splitter;

wherein the control circuit converges a wavelength and intensity of an output signal light of said wavelength variable light source to a target wavelength value and a target intensity value, wherein said control circuit comprises:

one or more monitoring circuits for monitoring one or more operation states including the wavelength and the intensity of the output signal light as well as a current and temperature of the wavelength variable semiconductor laser;

a parameter table in which a combination of said target wavelength and said target intensity is correlated with one or more target values of the operation states; and a conversion factor table in which a combination of a target wavelength $\lambda(o)$ and a target light intensity $Pow(o)$ are correlated by a conversion factor $\alpha(\lambda(o), Pow(o))$;

wherein the control circuit converts a current monitoring value, L2, into a light output intensity monitoring value, Pow, based at least in part on $\alpha(\lambda(o), Pow(o)) \times L2$;

wherein the control circuit uses both an arrangement for compensating a target wavelength dependency of a conversion factor of $\beta(\lambda)$, and an arrangement of compensating a target light output intensity dependency of a correction factor $\chi(Pow)$ to correct Pow to produce a corrected Pow;

wherein when the control circuit receives a command for changing the target wavelength and the target intensity from a CPU control device, said wavelength variable light source system determines the one or more target values of the operation states corresponding to the combination of the target wavelength and the target intensity in accordance with said parameter table;

wherein the wavelength variable light source system controls the wavelength variable light source so that the operation states monitored by output values of the monitoring circuits converge to the target values of the operational states;

wherein said control circuit determines a target value for controlling wavelength and a target value for controlling light output intensity based on the one or more target values of said operation states;

wherein determining said target value for controlling the light output intensity includes at least one of: the driving current of said optical amplifier, a light-receiving current of said first photo diode, and a light-receiving intensity of said first photo diode; and wherein determining said target value for controlling the wavelength includes a ratio between the light-receiving current of the first photo diode and a light-receiving current of the second photo diode and a ratio between light-receiving intensity of the first photo diode and a light-receiving intensity of the second photo diode.

12. The method of claim 11, wherein said control circuit comprises:

a monitoring circuit for monitoring the ambient temperature; and a target value correction table correlating the ambient temperature and a correction value of the target value of the operation state, wherein when the control circuit receives a command for changing a target wavelength and a target intensity from a CPU control device said control circuit determines the target value of the operation state corresponding to the specified combination of target wavelength and target intensity in accordance with said parameter table;

determines the correction value of the target value of the operation state corresponding to the ambient temperature at that moment by referencing the target value correction table; and controls said wavelength variable light source so that the monitoring value of the operation state based on the output value of said monitoring circuit converges to said correction value.

13. The method of claim 11, wherein said control circuit comprises an AD conversion circuit provided per each monitoring circuit, wherein the AD conversion circuit converts the output value of said monitoring circuit into a digital signal;

wherein the AD conversion circuit determines at least one of; a monitoring value conversion factor for controlling wavelength, and a monitoring value conversion factor for controlling light output intensity by correlating with said combination of target wavelength and target intensity; and wherein the AD conversion circuit controls said wavelength variable light source so that the value converted from an output value of said AD conversion circuit by said monitoring value conversion factor converges to said target value.

14. The method of claim 11, wherein said wavelength variable semiconductor laser is a semiconductor laser capable of controlling wavelength by one or more of adjusting its diode temperature and adjusting its driving current.

15. The method of claim 13, wherein said control circuit comprises:

a wavelength dependent factor table correlating said target wavelength with the wavelength dependent component of said monitoring value conversion factor; and a correction factor table correlating said target intensity with an output value correction factor of said AD converting circuit, wherein the control circuit determines the wavelength dependent component of said monitoring value conversion factor corresponding to said target wavelength based on said wavelength dependent factor table;

wherein the control circuit determines said output value correction factor corresponding to said target intensity by referencing said correction factor table; and wherein the control circuit uses a value obtained by multiplying said wavelength dependent component with said output value correction factor as said monitoring value conversion factor.

16. The wavelength variable light source system according to claim 1, wherein said control circuit comprises:

a wavelength dependent factor table in which the target wavelength $\lambda(o)$ is correlated with a conversion factor $\beta(\lambda)$;

a correction factor table in which the target light output intensity $Pow(o)$ is correlated with the correction factor $\chi(Pow)$;

wherein the control circuit determines that the conversion factor $\beta(\lambda)$ corresponds to the target wavelength $\lambda(o)$ by referencing the wavelength dependent factor table;

wherein the control circuit determines that the correction factor $\chi(Pow)$ corresponds to the target light output intensity $Pow(o)$ by referencing the correction factor table; and wherein the control circuit uses a value obtained by multiplying the conversion factor $\beta(\lambda)$ with the correction factor $\chi(Pow)$ in place of the conversion factor $\alpha(\lambda(o), Pow(o))$.

17. The method of claim 11, wherein said control circuit comprises:

a wavelength dependent factor table in which the target wavelength $\lambda(o)$ is correlated with a conversion factor $\beta(\lambda)$;

a correction factor table in which the target light output intensity $Pow(o)$ is correlated with the correction factor $\chi(Pow)$;

wherein the control circuit determines that the conversion factor $\beta(\lambda)$ corresponds to the target wavelength $\lambda(o)$ by referencing the wavelength dependent factor table;

wherein the control circuit determines that the correction factor $\chi(Pow)$ corresponds to the target light output intensity $Pow(o)$ by referencing the correction factor table; and wherein the control circuit uses a value obtained by multiplying the conversion factor $\beta(\lambda)$ with the correction factor $\chi(Pow)$ in place of the conversion factor $\alpha(\lambda(o), Pow(o))$.

* * * * *